(12) United States Patent
Park et al.

(10) Patent No.: US 12,114,542 B2
(45) Date of Patent: Oct. 8, 2024

(54) DISPLAY DEVICE AND ELECTRONIC APPARATUS

(71) Applicant: Samsung Display Co., Ltd., Yongin-si (KR)

(72) Inventors: Sangha Park, Yongin-si (KR); Seungyong Song, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 150 days.

(21) Appl. No.: 17/123,025

(22) Filed: Dec. 15, 2020

(65) Prior Publication Data
US 2021/0335969 A1 Oct. 28, 2021

(30) Foreign Application Priority Data

Apr. 22, 2020 (KR) .................. 10-2020-0048868

(51) Int. Cl.
| | | |
|---|---|---|
| *H01L 27/146* | (2006.01) | |
| *H10K 59/126* | (2023.01) | |
| *H10K 59/38* | (2023.01) | |
| *H10K 59/65* | (2023.01) | |

(52) U.S. Cl.
CPC ........... *H10K 59/126* (2023.02); *H10K 59/38* (2023.02); *H10K 59/65* (2023.02)

(58) Field of Classification Search
CPC ............... H01L 27/3272; H01L 27/322; H01L 27/3234; H01L 27/3216; H01L 27/3218; H01L 27/326; H01L 51/5284; H01L 27/3244; H01L 27/3225; H01L 27/3258; H10K 59/126; H10K 59/38; H10K 59/65; H10K 50/865; H10K 59/121; H10K 59/353; H10K 59/352; H10K 59/12; H10K 59/00; H10K 59/124
See application file for complete search history.

(56) References Cited

U.S. PATENT DOCUMENTS

| | | | |
|---|---|---|---|
| 9,761,651 B2 | 9/2017 | Chang et al. | |
| 10,288,926 B2 | 5/2019 | Tae et al. | |
| 10,409,123 B2 | 9/2019 | Oh et al. | |

(Continued)

FOREIGN PATENT DOCUMENTS

| | | | |
|---|---|---|---|
| CN | 202177714 U | * | 3/2012 |
| KR | 10-2016-0113362 | | 9/2016 |

(Continued)

*Primary Examiner* — Samuel Park
(74) *Attorney, Agent, or Firm* — Lewis Roca Rothgerber Christie LLP

(57) ABSTRACT

A display device includes: a plurality of light-emitters including a first light-emitter in a first display area and a second light-emitter in a second display area, the first light-emitter and second light-emitter configured to emit light of a same color, the second display area having a higher light transmissivity than the first display area; an insulating layer including a first through-hole and a second through-hole; and a filter disposed on the plurality of light-emitters and including a light-shield and color filters. The first through-hole of the insulating layer overlaps the first electrode of the first light-emitter, and the second through-hole of the insulating layer overlaps the first electrode of the second light-emitter, and at least a portion of the second through-hole overlaps the light-shield.

20 Claims, 18 Drawing Sheets

(56) References Cited

U.S. PATENT DOCUMENTS

| | | | |
|---|---|---|---|
| 2016/0035799 A1* | 2/2016 | Chang | H10K 59/352 |
| | | | 257/89 |
| 2017/0179209 A1* | 6/2017 | Kim | H10K 59/122 |
| 2017/0256747 A1* | 9/2017 | Lee | H10K 59/353 |
| 2018/0197922 A1* | 7/2018 | Song | H10K 50/805 |
| 2021/0065625 A1* | 3/2021 | Wang | H10K 59/35 |

FOREIGN PATENT DOCUMENTS

| | | |
|---|---|---|
| KR | 10-2016-0117728 | 10/2016 |
| KR | 10-1701368 | 2/2017 |
| KR | 10-1842052 | 5/2018 |
| KR | 10-2018-0079045 | 7/2018 |
| KR | 10-2018-0091999 | 8/2018 |

\* cited by examiner

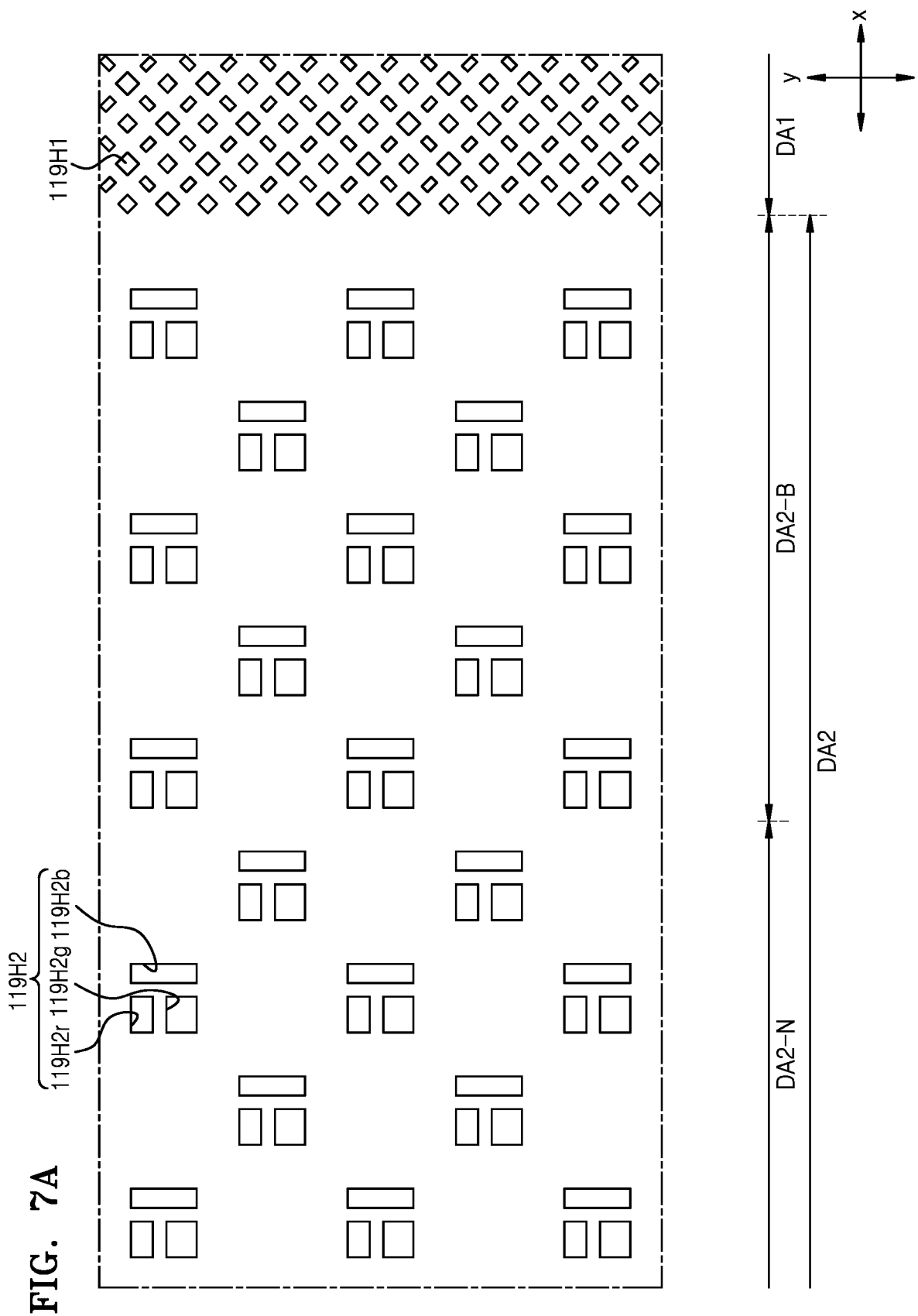

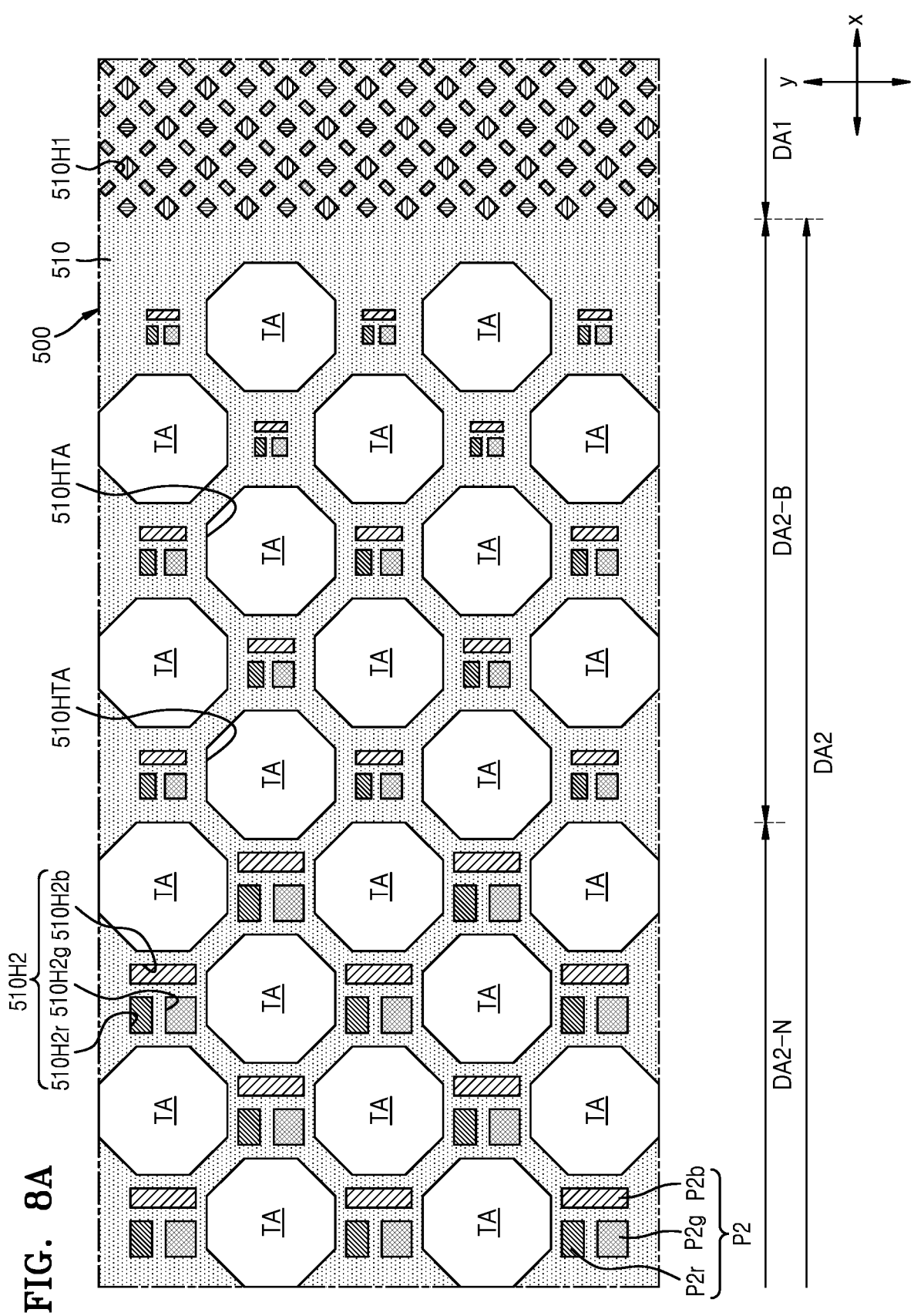

DISPLAY DEVICE AND ELECTRONIC APPARATUS

CROSS-REFERENCE TO RELATED APPLICATION

This application claims priority from and the benefit of Korean Patent Application No. 10-2020-0048868, filed on Apr. 22, 2020, which is hereby incorporated by reference for all purposes as if fully set forth herein.

BACKGROUND

Field

Exemplary implementations of the invention relate generally to a display device and an electronic apparatus including the same and more specifically, to a display device having different display areas and an electronic apparatus including the same.

Discussion of the Background

Recently, the usage of display devices has diversified. Also, display devices have become thinner and lighter, and thus, the usage of display devices have expanded.

By increasing the size of the display area in a display device, the display device has added various functions connected or related thereto. In order to increase the area and add various functions, researches have been conducted into a display device having a display area for adding various functions other than an image displaying function.

The above information disclosed in this Background section is only for understanding of the background of the inventive concepts, and, therefore, it may contain information that does not constitute prior art.

SUMMARY

Applicant discovered that the boundary (interface) between different areas of a display device, such as the interface between a hole for an electronic component like a camera and the surrounding display area, can been seen by a user when the number of pixels and the aperture ratio of pixels in the different areas of the display device are markedly different from each other.

Display devices constructed according to the principles and some exemplary implementations of the invention prevent or minimize the visibility of the boundary (interface) between the different areas of the display device, e.g., by adjusting the density of the pixels in the different areas of the display device or adjusting the sizes of the pixels in the different areas of each display device. For example, the number of the pixels and/or the sizes of the pixels in the interface between the different areas of each display device can be gradually changed.

In display devices constructed according to the principles and some exemplary implementations of the invention, the pixels may be defined by simply using a light-shield member, without adjusting the size (e.g., the width) of the through-hole of the upper insulating layer. Thus, by using a relatively simple process, the density of the pixels (for example, the number or aperture ratio of the pixels) may be adjusted. By adjusting the density of the pixels as described above, the visibility of the boundary between the first display area and the second display area may be reduced or entirely prevented from being seen by a user.

Display devices constructed according to the principles and some exemplary implementations of the invention include a pixel arrangement in the display area that is variously designed to add various functions. For example, the structural design of the pixels arranged in each of a first display area and a second display area may differ from each other to achieve various functions or effects.

Additional features of the inventive concepts will be set forth in the description which follows, and in part will be apparent from the description, or may be learned by practice of the inventive concepts.

According to an aspect of the invention, a display device includes: a plurality of light-emitters including a first light-emitter in a first display area and a second light-emitter in a second display area, the first light-emitter and second light-emitter configured to emit light of a same color, the second display area having a higher light transmissivity than the first display area; an insulating layer including a first through-hole and a second through-hole; and a filter disposed on the plurality of light-emitters and including a light-shield and color filters, wherein: the first through-hole of the insulating layer overlaps the first electrode of the first light-emitter, and the second through-hole of the insulating layer overlaps the first electrode of the second light-emitter, and at least a portion of the second through-hole overlaps the light-shield.

The light-shield may include: a first opening overlapping the first through-hole of the insulating layer; and a second opening overlapping the second through-hole of the insulating layer, and wherein the first opening may have a first size and the second opening has a second size less than the first size.

The color filters may include: a first color filter disposed in the first opening; and a second color filter disposed in the second opening and having substantially a same color as the first color filter.

The second size of the second opening may be less than a size of the second through-hole of the insulating layer.

The second through-hole of the insulating layer may be substantially entirely covered by the light-shield.

The light-emitters may include display elements, the filter comprises a filter layer, and the light-shield may include a portion of the filter layer.

According to another aspect of the invention, a display device includes: a plurality of light-emitters; an insulating layer including a plurality of through-holes overlapping first electrodes of the plurality of light-emitters; a light-shield disposed on the plurality of light-emitters and including a plurality of openings, the plurality of openings defining pixels and overlapping at least one of the plurality of through-holes of the insulating layer; and color filters disposed in the plurality of openings of the light-shield, wherein the at least one of the plurality of through-holes of the insulating layer overlaps the light-shield.

A number or an aperture ratio of pixels in a first unit area may be greater than a number or an aperture ratio of pixels in a second unit area, and the first unit area and the second unit area may have substantially a same size.

The plurality of light-emitters may include a first light-emitter and a second light-emitter configured to emit light of a same color, the insulating layer may include a first through-hole overlapping the first electrode of the first light-emitter and a second through-hole overlapping the first electrode of the second light-emitter, and the second through-hole of the insulating layer overlaps the light-shield.

A portion of the second through-hole of the insulating layer may overlap one of the plurality of openings of the light-shield, and a remaining portion of the second through-hole may overlap the light-shield.

Another one of the plurality of openings of the light-shield may overlap the first through-hole of the insulating layer, and the one of the plurality of openings of the light-shield may have a size less than a size of the another one of the plurality of openings of the light-shield.

The color filters may include: a first color filter disposed in the another one of the plurality of openings in the light-shield; and a second color filter located in the one of the plurality of openings of the light-shield and having substantially a same color as the first color filter.

The second through-hole of the insulating layer may be substantially entirely covered by the light-shield.

The light-emitters may include display elements and the light-shield may include a portion of a filter layer.

According to another aspect of the invention, an electronic apparatus includes: a display device including a first display area and a second display area having a higher transmissivity than the first display area; and a component overlapping the second display area, wherein the display device includes: a plurality of light-emitters; an insulating layer comprising a plurality of through-holes; a light-shield disposed on the plurality of light-emitters and including a plurality of openings, the plurality of openings defining pixels and overlapping at least one of the plurality of through-holes of the insulating layer; and color filters disposed in the plurality of openings of the light-shield, wherein at least one of the plurality of through-holes of the insulating layer overlaps the light-shield.

A number or an aperture ratio of pixels in a first unit area may be greater than a number or an aperture ratio of pixels in a second unit area, and the first unit area and the second unit area may have substantially a same size.

The plurality of light-emitters may include a first light-emitter and a second light-emitter configured to emit light of a same color, the insulating layer may include a first through-hole overlapping the first electrode of the first light-emitter and a second through-hole overlapping the first electrode of the second light-emitter, and at least a portion of the second through-hole may overlap the light-shield.

A portion of the second through-hole of the insulating layer may overlap one of the plurality of openings of the light-shield, and a remaining portion of the second through-hole may overlap the light-shield.

Another one of the plurality of openings of the light-shield may overlap the first through-hole of the insulating layer, and the one of the plurality of openings of the light-shield may be a size less than a size of the another one of the plurality of openings of the light-shield.

The color filters may include: a first color filter disposed in the another one of the plurality of openings of the light-shield; and a second color filter disposed in the one of the plurality of openings of the light-shield and having a same color as the first color filter.

The second through-hole of the insulating layer may be substantially entirely covered by the light-shield.

The component may include a sensor or a camera.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 7A is a plan view of an upper insulating layer used in a process of manufacturing the display device of FIG. 1.

FIG. 8A is a plan view of a filter layer used in a process of manufacturing the display device of FIG. 1.

DETAILED DESCRIPTION

Figure 1:
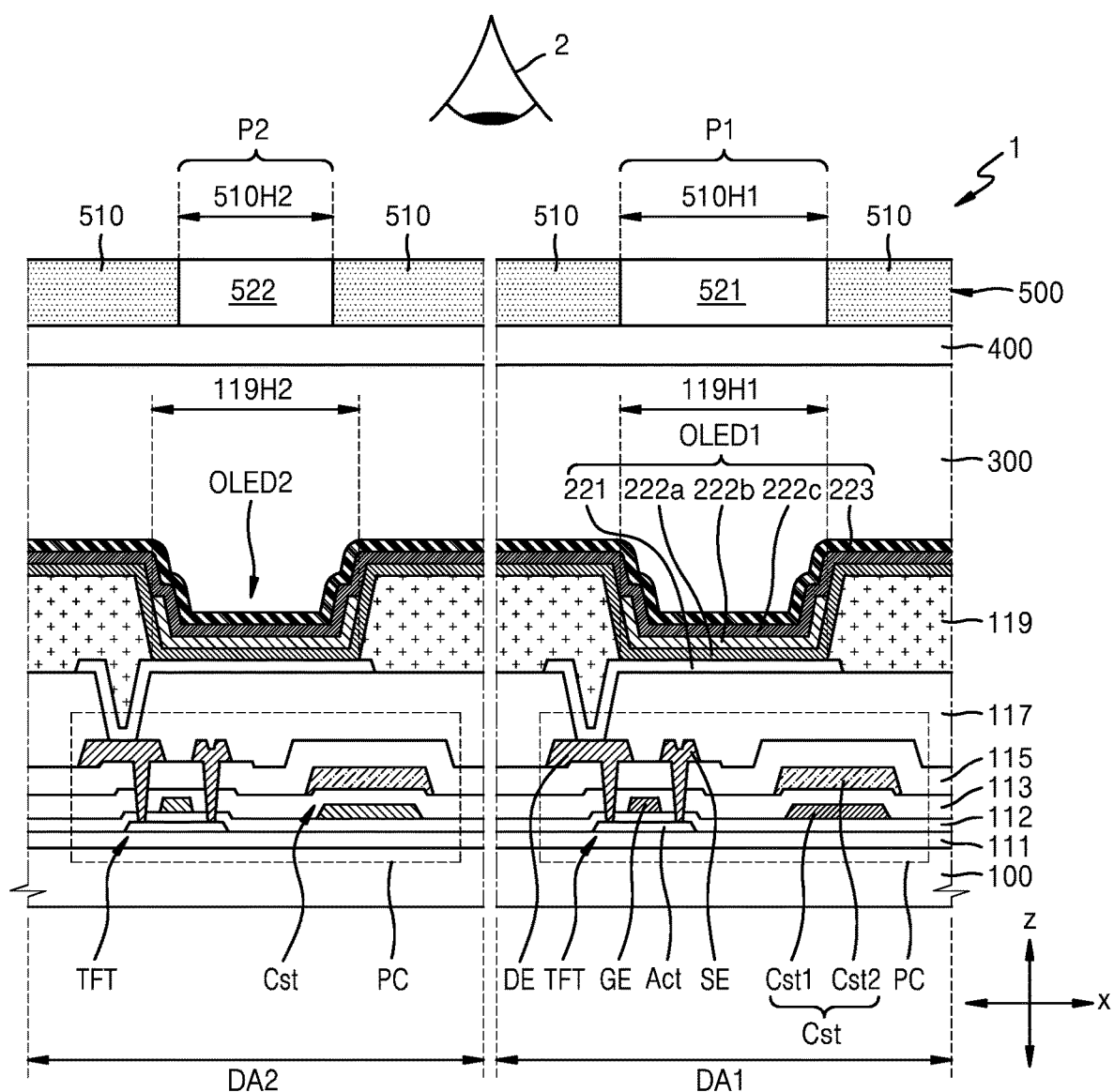
FIG. 1 is a schematic cross-sectional view illustrating an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic cross-sectional view illustrating an exemplary embodiment of a display device constructed according to the principles of the invention.

Referring to FIG. 1, the display device 1 may include a first display area DA1 and a second display area DA2. The display device 1 may include a plurality of light-emitters in the form of a plurality of display elements disposed in each of the first display area DA1 and the second display area DA2. The display element may include a light-emitting diode, for example, an organic light-emitting diode. As illustrated in FIG. 1, a first organic light-emitting diode OLED1 may be disposed in the first display area DA1, and a second organic light-emitting diode OLED2 may be disposed in the second display area DA2. Although FIG. 1 illustrates that the display device may include the organic light-emitting diode OLED as a light-emitter, the display device of the disclosure is not limited thereto. In another embodiment, the display device may include a light-emitting display device including an inorganic material such as a micro LED, for example, an inorganic light emitting display or an inorganic display device, or a display device such as a quantum-dot light-emitting display device. For example, the light-emitter of the display device may include an organic material, an inorganic material, quantum dots, an organic material and quantum dots, or an inorganic material and quantum dots.

Each of the first and second organic light-emitting diodes OLED1 and OLED2 may be electrically connected to a pixel circuit PC located on a substrate 100. The substrate 100 may include glass materials or polymer resins.

A buffer layer 111 may be disposed on the substrate 100. The buffer layer 111 may reduce or prevent the penetration of impurities, moisture, or external materials from therebelow and may provide a planarization surface on the substrate 100. The buffer layer 111 may include an inorganic insulating material, such as silicon oxide, silicon oxynitride, and silicon nitride, and may be formed as a single layer or multiple layers including the materials thereof.

The pixel circuit PC may include a thin-film transistor TFT and a storage capacitor Cst disposed on the buffer layer 111. The thin-film transistor TFT may include a semiconductor layer Act, a gate electrode GE overlapping a channel area of the semiconductor layer Act, and a source electrode SE and a drain electrode DE connected to a source area and a drain area of the semiconductor layer Act, respectively. A gate insulating layer 112 may be disposed between the semiconductor layer Act and the gate electrode GE, and a first interlayer insulating layer 113 and a second interlayer insulating layer 115 may be disposed between the gate electrode GE and the source electrode SE or between the gate electrode GE and the drain electrode DE.

The storage capacitor Cst may include a first storage capacitor plate Cst1 and a second storage capacitor plate Cst2 overlapping each other. The first interlayer insulating layer 113 may be disposed between the first and second storage capacitor plates Cst1 and Cst2.

The semiconductor layer Act may include polysilicon. In some exemplary embodiments, the semiconductor layer Act may include amorphous silicon. In other exemplary embodiments, the semiconductor layer Act may include an oxide of at least one selected from the group consisting of In, Ga, Sn, Zr, V, Hf, Cd, Ge, Cr, Ti, and Zn.

The gate insulating layer 112 may include an inorganic insulating material, such as silicon oxide, silicon oxynitride, and silicon nitride, and may be formed as a single layer or multiple layers including the materials thereof.

The gate electrode GE and/or the first storage capacitor plate Cst1 may include a low-resistive conductive material, such as Mo, Al, Cu, and/or Ti, and may be formed as a single layer or multiple layers including the materials thereof.

The first interlayer insulating layer 113 may include an inorganic insulating material, such as silicon oxide, silicon oxynitride, and silicon nitride, and may be formed as a single layer or multiple layers including the materials thereof.

The second storage capacitor plate Cst2 may include Al, Pt, Pd, Ag, Mg, Au, Ni, Nd, Ir, Cr, Li, Ca, Mo, Ti, W, and/or Cu, and may be formed as a single layer or multiple layers including the materials thereof.

The second interlayer insulating layer 115 may include an inorganic insulating material, such as silicon oxide, silicon oxynitride, and silicon nitride, and may be formed as a single layer or multiple layers including the materials thereof.

The source electrode SE or the drain electrode DE may include Al, Pt, Pd, Ag, Mg, Au, Ni, Nd, Ir, Cr, Ca, Mo, Ti, W, and/or Cu, and may be formed as a single layer or multiple layers including the materials thereof. For example, the source electrode SE or the drain electrode DE may be formed as a triple layer including titanium/aluminum/titanium layers.

A planarization insulating layer 117 may include a different material from at least one inorganic insulating layer disposed below the planarization insulating layer 117. For example, the planarization insulating layer 117 may include a different material from the gate insulating layer 112, the first interlayer insulating layer 113, and the second interlayer insulating layer 115. The planarization insulating layer 117 may include an organic insulating material, such as acryl, benzocyclobutene (BCB), polyimide, hexamethyldisiloxane (HMDSO), or the like.

A first electrode, which may be in the form of a pixel electrode 221, may be formed on the planarization insulating layer 117. The pixel electrode 221 may be electrically connected to the thin-film transistor TFT via a contact hole formed in the planarization insulating layer 117.

The pixel electrode 221 may include a reflective layer including Ag, Mg, Al, Pt, Pd, Au, Ni, Nd, Ir, Cr, or a compound thereof. The pixel electrode 221 may include a transparent conductive layer disposed above and/or below the reflective layer. The transparent conductive layer may include indium tin oxide (ITO), indium zinc oxide (IZO), zinc oxide (ZnO), indium oxide ($In_2O_3$), indium gallium oxide (IGO), aluminum zinc oxide (AZO), or the like. According to an exemplary embodiment, the pixel electrode 221 may have a three-layered structure including ITO/Ag/ITO layers.

An upper insulating layer 119 may cover an edge of the pixel electrode 221 and may include a through-hole exposing a center of the pixel electrode 221. As illustrated in FIG. 1 a first through-hole 119H1 and a second through-hole 119H2 formed in the upper insulating layer 119 may expose OLED1 and OLED2, respectively. The upper insulating layer 119 may include an organic insulating material, such as BCB, polyimide, HMDSO, or the like. The first and second through-holes 119H1 and 119H2 of the upper insulating layer 119 may define an emission area (e.g., OLED1 and OLED2). The emission area is an area in which a red, green, or blue light is emitted.

An emission layer 222b may overlap the pixel electrode 221 through the first or second through-hole 119H1 or 119H2 of the upper insulating layer 119. The emission layer 222b may include an organic material. The emission layer 222b may include a high molecular-weight organic material or a low molecular-weight organic material configured to emit light of a certain color. The emission layer 222b may be formed by a deposition process using a mask, as described above.

A first functional layer 222a may be disposed below the emission layer 222b, and a second functional layer 222c may be disposed above the emission layer 222b. Alternatively, the first functional layer 222a may be disposed above the emission layer 222b, and the second functional layer 222c may be disposed below the emission layer 222b.

The first functional layer 222a may include a single layer or multiple layers. For example, when the first functional layer 222a includes a high molecular-weight material, the first functional layer 222a may include a hole transport layer (HTL) having a single-layered structure, and may include poly-(3,4)-ethylene-dioxy thiophene (PEDOT) or polyaniline (PANT). When the first functional layer 222a includes a low molecular-weight material, the first functional layer 222a may include a hole injection layer (HIL) and a hole transport layer (HTL).

The second functional layer 222c may include an electron transport layer (ETL) and/or an electron injection layer (EIL).

A second electrode, which may be in the form of an opposite electrode 223, may include a conductive material having a relatively low work function. For example, the opposite electrode 223 may include a transparent layer including Ag, Mg, Al, Ni, Cr, Li, Ca, and/or an alloy thereof.

For example, the opposite electrode 223 may include a semi transparent layer including Ag, Mg, Al, Ni, Cr, Li, Ca, and/or an alloy thereof. Alternatively, the opposite electrode 223 may further include a layer, such as ITO, IZO, ZnO, or In$_2$O$_3$, on the transparent layer or the semi transparent layer. According to an exemplary embodiment, the opposite electrode 223 may include Ag and Mg. The opposite electrode 223 may be integrally formed to generally cover the first and second display areas DA1 and DA2.

A stacked structure of the pixel electrode 221, the emission layer 222b, and the opposite electrode 223 may form a light-emitting diode. For example, the stacked structure may form each of the first organic light-emitting diode OLED1 and the second organic light-emitting diode OLED 2. The material of the emission layer 222b may be different according to the color of light emitted from the first and second organic light-emitting diodes OLED1 and OLED2. The emission layer 222b may include a material for emitting light of red, green, and/or blue colors, according to a pixel, in which the emission layer 222b is located.

An encapsulation layer 300 may be located on the first and second organic light-emitting diodes OLED1 and OLED2. The encapsulation layer 300 may be integrally formed to entirely cover the first and second display areas DA1 and DA2. The encapsulation layer 300 may include a flexible encapsulation layer including an inorganic insulating material and an organic insulating material or a substrate including a rigid material, such as encapsulation glass.

An input sensing layer 400 may be disposed on the encapsulation layer 300. Coordinate information according to an external input, for example, a touch event of a finger or an object such as a stylus pen, may be obtained. The input sensing layer 400 may include a touch electrode and trace lines connected to the touch electrode. The input sensing layer 400 may sense an external input by using a mutual capacitive method or a self capacitive method.

A filter may be in the form of a filter layer 500 may be disposed on the input sensing layer 400. The filter layer 500 may increase a light efficiency at a front surface and/or a visibility at a side surface of light emitted from the organic light-emitting diode OLED and may prevent degradation in visibility caused by reflection of light incident toward the display device from the outside. The filter layer 500 may include a filter plate including a light-shield in the form of a light-shield portion 510, a first color filter 521 and a second color filter 522. When the filter plate is provided to prevent reflection, the thickness of the display device may be reduced compared to when a polarization plate is used. Also, degradation of the transmission rate due to the polarization plate may be prevented.

The light-shield portion 510 may include a non-transparent inorganic insulating material, such as chromic oxide or molybdenum oxide, or a non-transparent organic insulating material, such as black resins and the like.

The first and second color filters 521 and 522 may include a pigment or a dye having a certain color (for example, a red, green, or blue color). The first color filter 521 may be disposed to overlap the first organic light-emitting diode OLED1 located in the first display area DA1, and the second color filter 522 may be disposed to overlap the second organic light-emitting diode OLED2 located in the second display area DA2.

The first and second color filters 521 and 522 may be received in a first opening such as hole 510H1 and a second opening such as hole 510H2 of the light-shield portion 510, respectively. The first and second color filters 521 and 522 may be located in the first hole 510H1 and a second hole 510H2 of the light-shield portion 510, respectively. The first and second color filters 521 and 522 may overlap the first and second organic light-emitting diodes OLED1 and OLED2, respectively. For example, light of a predetermined color (for example, red, green, or blue) emitted from the first organic light-emitting diode OLED1 may pass through the first color filter 521, and light of a predetermined color (for example, red, green, or blue) emitted from the second organic light-emitting diode OLED2 may pass through the second color filter 522. The first color filter 521 may have the same color as the light emitted from the first organic light-emitting diode OLED1 overlapping the first color filter 521. Likewise, the second color filter 522 may have the same color as the light emitted from the second organic light-emitting diode OLED2 overlapping the second color filter 522.

The first hole 510H1 and the second hole 510H2 of the light-shield portion 510 may overlap the first organic light-emitting diode OLED1 and the second organic light-emitting diode OLED2, respectively. The first hole 510H1 may overlap the first organic light-emitting diode OLED1, and the second hole 510H2 may overlap the second organic light-emitting diode OLED2.

The first hole 510H1 and/or the second hole 510H2 may have a width smaller than the width of the emission area (through-hole of the upper insulating layer 119) of the organic light-emitting diode corresponding thereto, and thus, the light-shield portion 510 may cover at least a portion of the emission area of the organic light-emitting diode. For example, the width of the emission area of the organic light-emitting diode may be defined by the width of the through-hole of the upper insulating layer 119. Thus, when the light-shield portion 510 covers at least a portion of the emission area of the organic light-emitting diode, the light-shield portion 510 covers at least a portion of the through-hole of the upper insulating layer 119.

According to an exemplary embodiment, as illustrated in FIG. 1, the width of the second hole 510H2 may be less than the width of the second through-hole 119H2, which is the width of an emission area of the second organic light-emitting diode OLED2. Thus, the light-shield portion 510 may overlap at least a portion of the emission area of the second organic light-emitting diode OLED2, and the second color filter 522 may overlap a remaining portion of the emission area of the second organic light-emitting diode OLED2. A portion of the second through-hole 119H2 of the upper insulating layer 119 may be overlapped by the second color filter 522, and a remaining portion of the second through-hole 119H2 may be overlapped by the light-shield portion 510. Light emitted from the second organic light-emitting diode OLED2 may be emitted toward the outside through the second hole 510H2, and thus, the size (e.g., width) of a second pixel P2 of the display device 1, which is seen by a user 2, may be defined by the size (e.g., width) of the second hole 510H2 of the light-shield portion 510. By controlling the relative sizes of the first and second holes in the light-shield portion in the boundary between display areas DA1 and DA2, which have different numbers or arrangement of underlying pixel structures, the visibility of the pixel structures in the boundary may be reduced or eliminated.

FIG. 1 illustrates that the width of the first hole 510H1 may be substantially the same as or greater than the width of the emission area of the first organic light-emitting diode OLED1. However, according to another exemplary embodiment, the width of the first hole 510H1 may be less than the width of the emission area of the first organic light-emitting diode OLED1. Light emitted from the first organic light-emitting diode OLED1 may be emitted toward the outside through the first hole 510H1 of the light-shield portion 510, and the size (width) of a first pixel P1 of the display device 1, which is seen by the user 2, may be defined by the size (width) of the first hole 510H1 of the light-shield portion 510.

The display device 1 having the structure described with reference to FIG. 1 may be included in electronic apparatuses, such as a mobile phone, a tablet personal computer (PC), a notebook computer, and a smart watch or a smart band worn on the wrist.

Figure 2A:
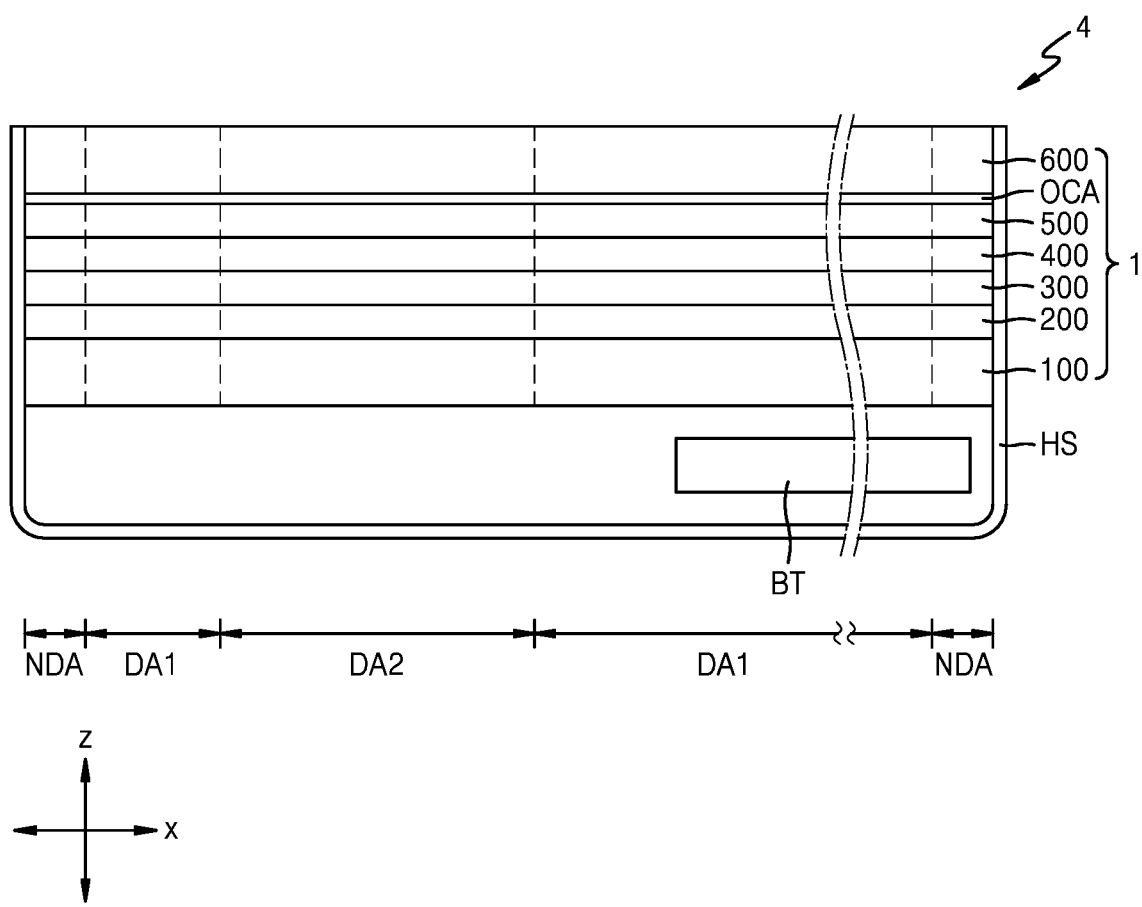
FIGS. 2A and 2B are schematic cross-sectional views illustrating exemplary embodiments of an electronic apparatus including the display device of FIG. 1.
Figure 2B:
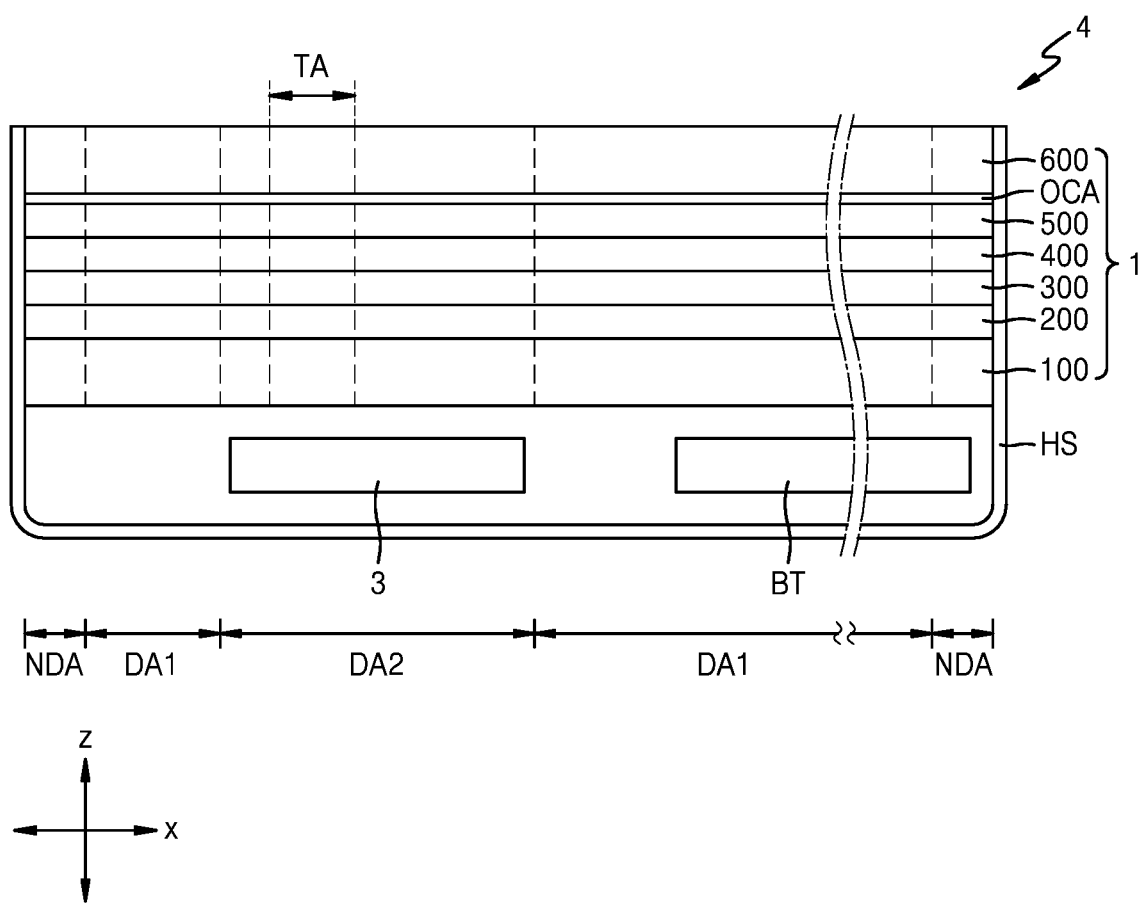

FIGS. 2A and 2B are schematic cross-sectional views illustrating exemplary embodiments of an electronic apparatus including the display device of FIG. 1.

Referring to FIG. 2A, the electronic apparatus 4 may include a housing HS having an inner space and an open side. The display device 1 may be accommodated in the housing HS through the open side of the housing HS. The housing HS may be coupled to a window 600.

The display device 1 may include the substrate 100, a display layer 200, the encapsulation layer 300, the input sensing layer 400, and the filter layer 500. The display layer 200 may include the pixel circuits PCs and the organic light-emitting diodes (for example, the first and second organic light-emitting diodes OLED1 and OLED2) described above with reference to FIG. 1. The organic light-emitting diodes of the display layer 200 are electrically connected to the pixel circuits PCs, respectively. The window 600 may be disposed on the filter layer 500. An adhesive layer, such as an optical clear adhesive (OCA), may be provided between the filter layer 500 and the window 600.

The electronic apparatus 4 may be disposed between a rear surface of the display device 1 and an inner surface of the housing HS and may include a plurality of elements for the operation of the electronic apparatus 4. For example, FIG. 2A illustrates a battery BT.

The electronic apparatus 4 may include a first display area DA1 peripheral to a second display area DA2. The first and second display areas DA1 and DA2 may be surrounded by a non-display area NDA in a plan view. A pixel circuit and an organic light-emitting diode disposed in the first display area DA1 of the electronic apparatus 4 are the same as described above with respect to the first display area DA1 of FIG. 1. A pixel circuit and an organic light-emitting diode disposed in the second display area DA2 of the electronic apparatus 4 are the same as described above with respect to the second display area DA2 of FIG. 1.

The electronic apparatus 4 according to some exemplary embodiments may include a component 3 disposed at a rear surface of the display device 1 as illustrated in FIG. 2B. For example, the component 3 may be disposed between the display device 1 and the housing HS. The component 3 may include electronic elements, such as a sensor configured to measure a distance, such as a proximity sensor, a sensor configured to recognize a part of a body of a user (for example, fingerprints, an iris, a face, etc.), a small lamp configured to output light, and an image sensor configured to capture an image (for example, a camera) or the like. The electronic elements may be operated based on light of various wavelength ranges, such as visible rays, infrared rays, ultraviolet rays, etc. Further, the electronic elements may be operated based on ultrasonic waves or sound in other frequency ranges.

The display device 1 may include a transmission area TA, through which light and/or sound emitted from or received into the component 3 described above may be transmitted. The transmission area TA may be provided or located in the second display area DA2. For example, the second display area DA2 has a higher transmissivity than the first display area DA1. A pixel circuit and an organic light-emitting diode may not be disposed in the transmission area TA.

Figure 3A:
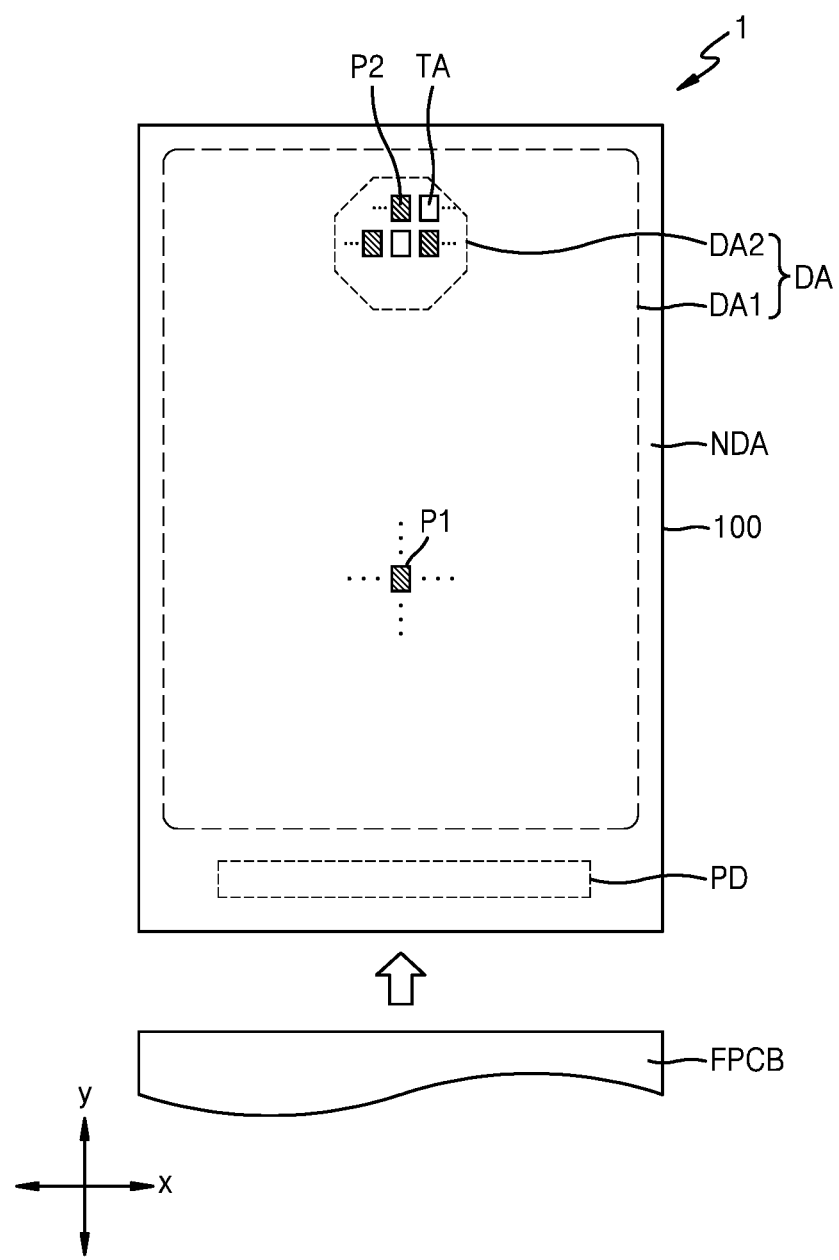
FIGS. 3A, 3B, and 3C are schematic plan views of the display device of FIG. 1 illustrating exemplary embodiments of different shaped display areas for accommodating an electronic component.
Figure 3B:
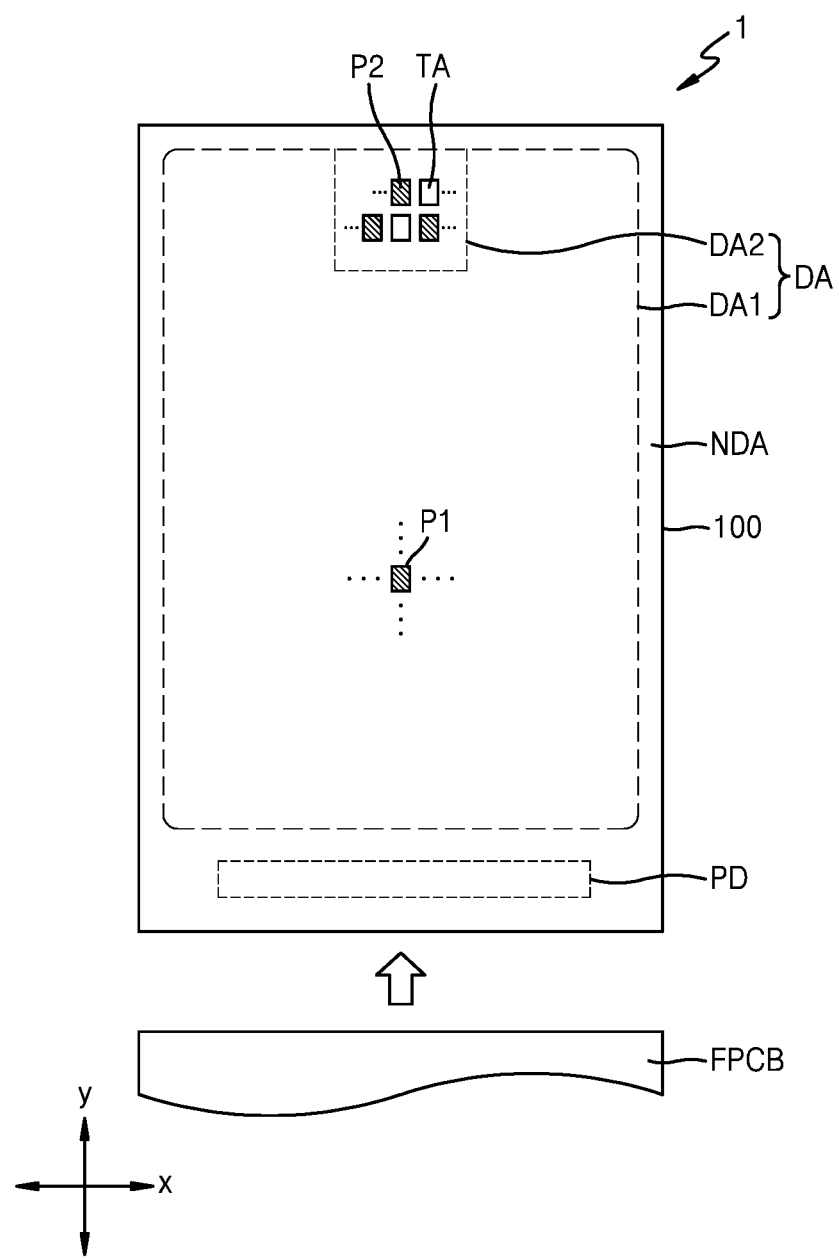
Figure 3C:
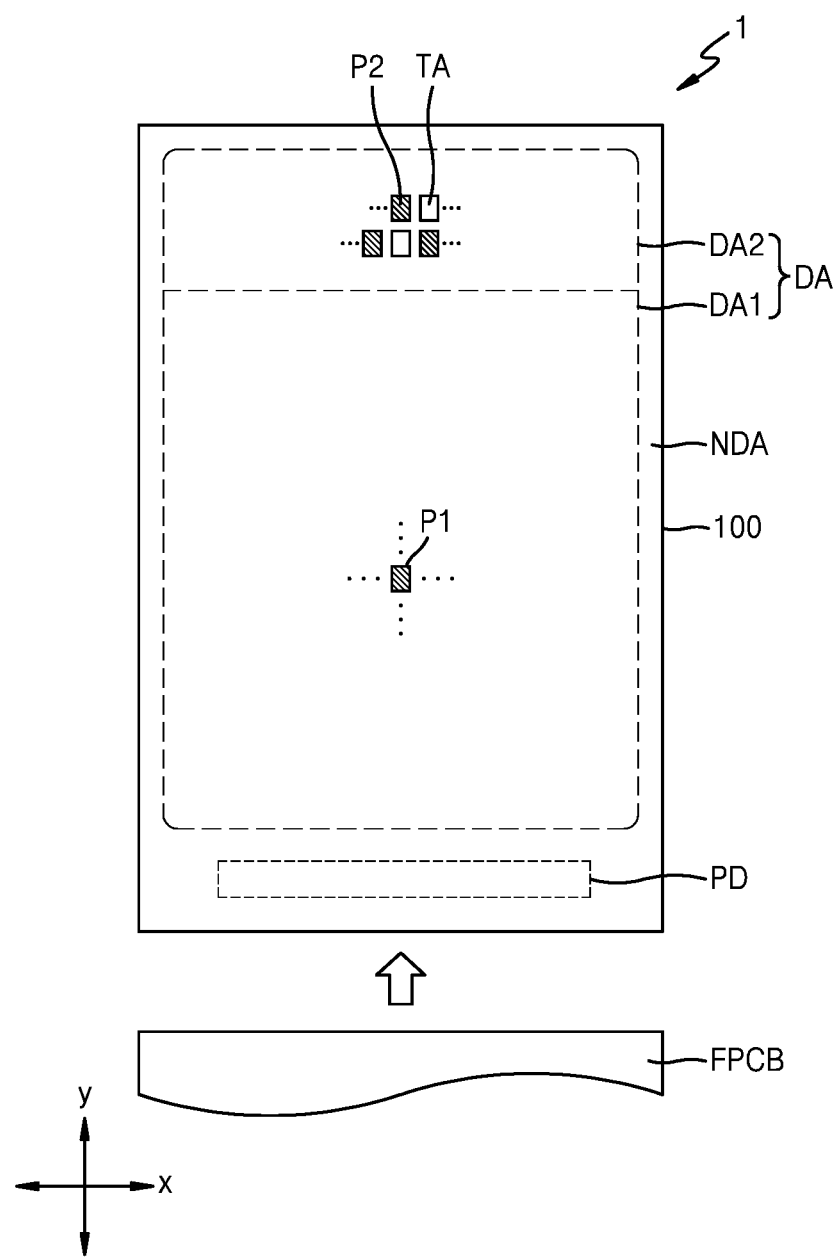

FIGS. 3A, 3B, and 3C are schematic plan views of the display device of FIG. 1 illustrating exemplary embodiments of different shaped display areas for accommodating an electronic component.

Referring to FIGS. 3A through 3C, the display device 1 may include an array of a plurality of pixels arranged on the substrate 100. The plurality of pixels may include first pixels P1 arranged in the first display area DA1 and second pixels P2 arranged in the second display area DA2.

The display area DA may include the first display area DA1 and the second display area DA2, and the size of the first display area DA1 and the size of the second display area DA2 may be different from each other. The size of the first display area DA1 may be greater than the size of the second display area DA2.

The second display area DA2 may have a polygonal shape in a plan view, such as an octagonal shape or a rectangular shape, as illustrated in FIGS. 3A through 3C. Alternatively, the second display area DA2 may have a circular shape or an oval shape. The second display area DA2 may be entirely surrounded by the first display area DA1 in a plan view as illustrated in FIG. 3A. Alternatively, as illustrated in FIGS. 3A and 3C, the second display area DA2 may be partially surrounded by the first display area DA1. For example, one or more of edges of the second display area DA2 may be adjacent to the first display area DA1 and the others may be disposed to be adjacent to the non-display area NDA.

The first pixels P1 emitting red light, green light, and blue light may be two-dimensionally arranged in the first display area DA1, and the second pixels P2 emitting red light, green light, and blue light may be two-dimensionally arranged in the second display area DA2. The transmission area TA may be disposed in the second display area DA2. The transmission area TA may be disposed between two adjacent second pixels P2.

The non-display area NDA may entirely surround the display area DA. A scan driver, a data driver, and the like may be disposed in the non-display area NDA. A pad PD may be located in the non-display area NDA. The pad PD may be disposed to be adjacent to any one of edges of the substrate 100. The pad PD may be exposed by not being covered by an insulating layer and may be electrically connected to a flexible printed circuit board FPCB. The flexible printed circuit board FPCB may electrically connect a controller to the pad PD and may transfer a signal or power from the controller to pixel circuits via the pad PD. In some exemplary embodiments, a data driver may be disposed in the flexible printed circuit board FPCB. The pad PD may be connected to a plurality of lines to transmit a signal or a voltage of the flexible printed circuit board FPCB to the first pixels P1 and the second pixels P2.

According to another exemplary embodiment, instead of the flexible printed circuit board FPCB, an integrated circuit may be disposed on the pad PD. The integrated circuit may include, for example, a data driver, and may be electrically connected to the pad PD via an anisotropic conductive film including a conductive ball.

The first display area DA1, in which the first pixels P1 are arranged, and the second display area DA2, in which the second pixels P2 are arranged, may provide an image. The organic light-emitting diodes (e.g., the first and second organic light-emitting diodes) corresponding to the first pixel P1 and the second pixel P2, respectively may be connected to the pixel circuits described above with reference to FIG. 1, and the pixel circuits may include a transistor and a capacitor.

Figure 4:
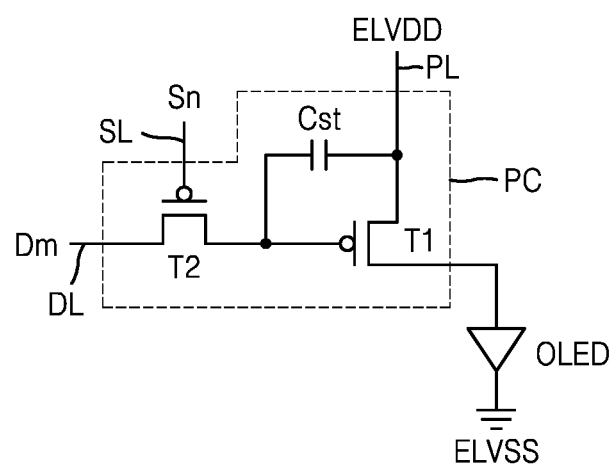
FIG. 4 is an equivalent circuit diagram of a representative pixel circuit connected to an organic light-emitting diode of the display device of FIG. 1.

FIG. 4 is an equivalent circuit diagram of a representative pixel circuit connected to an organic light-emitting diode of the display device of FIG. 1. The organic light-emitting diode OLED of FIG. 4 may correspond to the first and second organic light-emitting diodes OLED1 and OLED2 described above with reference to FIG. 1.

Referring to FIG. 4, the organic light-emitting diode OLED may be electrically connected to the pixel circuit PC. The pixel circuit PC may include a first thin-film transistor T1, a second thin-film transistor T2, and a storage capacitor Cst.

The second thin-film transistor T2 may include a switching thin-film transistor, may be connected to a scan line SL and a data line DL, and may be configured to transmit, to the first thin-film transistor T1, a data voltage (or a data signal Dm) provided from the data line DL, based on a switching voltage (or a switching signal Sn) provided from the scan line SL. The storage capacitor Cst may be connected to the second thin-film transistor T2 and a driving voltage line PL and may store a voltage corresponding to a difference between a voltage received from the second thin-film transistor T2 and a first power voltage ELVDD supplied to the driving voltage line PL.

The first thin-film transistor T1 may include a driving thin-film transistor and may be connected to the driving voltage line PL and the storage capacitor Cst. Also, the first thin-film transistor T1 may control a driving current flowing from the driving voltage line PL through the organic light-emitting diode OLED, according to a voltage value stored in the storage capacitor Cst. The organic light-emitting diode OLED may emit light having a certain brightness based on the driving current. A second electrode (for example, a cathode) of the organic light-emitting diode OLED may receive a second power voltage ELVSS.

FIG. 4 illustrates the case in which the pixel circuit PC includes two thin-film transistors and one storage capacitor. However, exemplary embodiments are not limited thereto. The number of thin-film transistors and the number of storage capacitors may be modified in various ways according to a design of the pixel circuit PC. For example, the pixel circuit PC may include three or more thin-film transistors and may include two or more capacitors.

Figure 5:
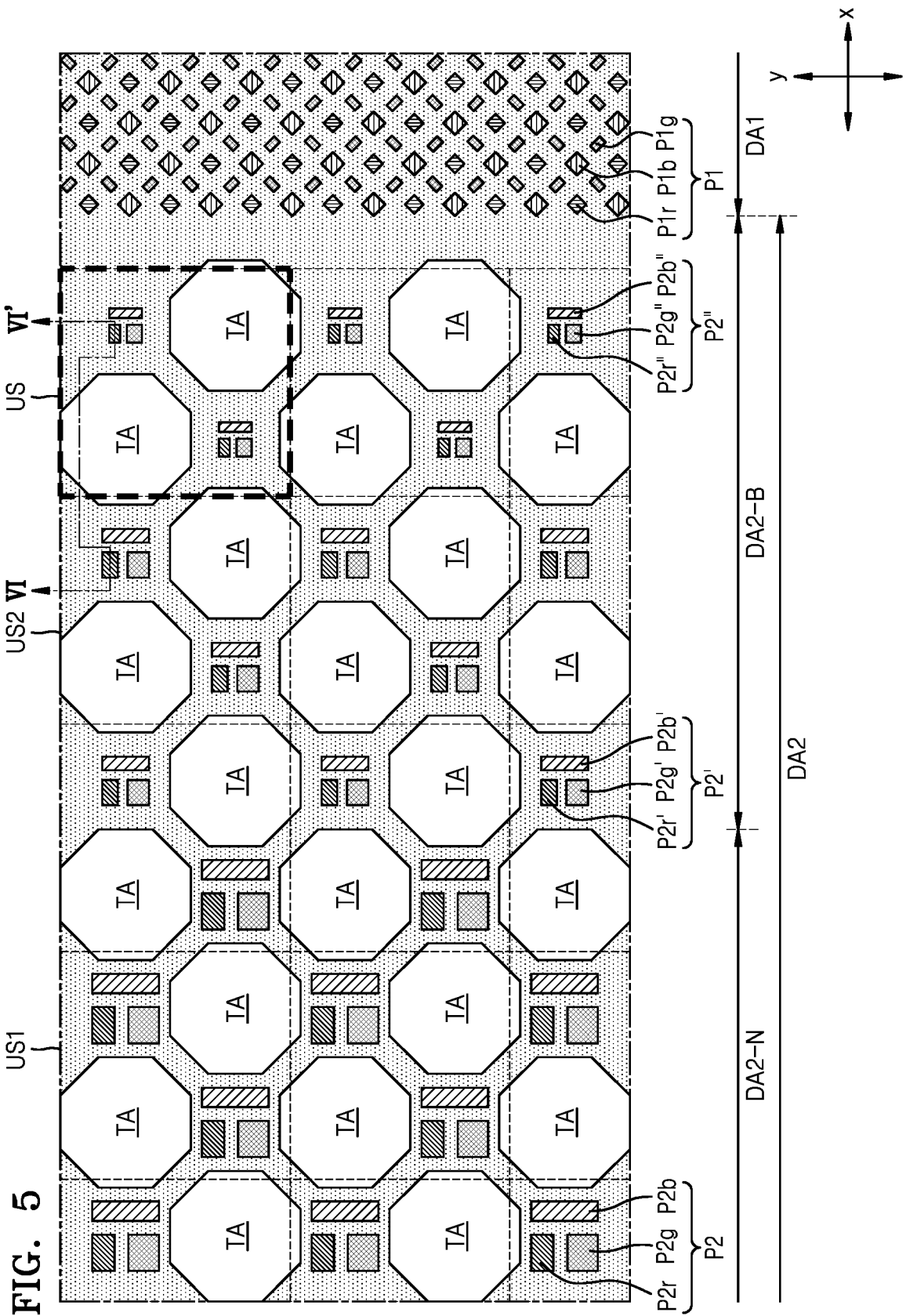
FIG. 5 is a plan view of a portion of the display device of FIG. 1 illustrating another exemplary embodiment of the display area.

FIG. 5 is a plan view of a portion of the display device of FIG. 1 illustrating another exemplary embodiment of the display area.

Referring to FIG. 5, first pixels P1 may be arranged in the first display area DA1 and the first pixels P1 may include a first red pixel P1r, a first green pixel P1g, and a first blue pixel P1b. In some exemplary embodiments, as illustrated in FIG. 5, the first red pixel P1r, the first green pixel P1g, and the first blue pixel P1b may be arranged as a pentile type. According to another exemplary embodiment, the first red pixel P1r, the first green pixel P1g, and the first blue pixel P1b may be arranged as a stripe type.

Second pixels P2, P2', and P2" may be arranged in the second display area DA2. The second pixels P2, P2', and P2" may include second red pixels P2r, P2r', and P2r", second green pixels P2g, P2g', and P2g", and second blue pixels P2b, P2b', and P2b". The second red pixels P2r, P2r', and P2r", the second green pixels P2g, P2g', and P2g", and the second blue pixels P2b, P2b', and P2b" may be different from the first red pixel P1r, the first green pixel P1g, and the first blue pixel P1b. In some exemplary embodiments, the second red pixels P2r, P2r', and P2r", the second green pixels P2g, P2g', and P2g", and the second blue pixels P2b, P2b', and P2b" may be elongated (stripe) type pixels. According to another exemplary embodiment, the second red pixels P2r, P2r', and P2r", the second green pixels P2g, P2g', and P2g", and the second blue pixels P2b, P2b', and P2b" may be the same type as the first red pixel P1r, the first green pixel P1g, and the first blue pixel P1b.

The transmission areas TA may be disposed in the second display area DA2. The transmission areas TA may be spaced apart from each other, and the second pixels P2, P2', and P2" may be arranged between adjacent transmission areas TA. For example, the transmission area TA may be disposed between at least two of the second pixels P2, P2', and P2". The transmission areas TA and the second pixels P2, P2', and P2" may be alternately disposed in an x-axis direction and a y-axis direction.

The second display area DA may include a second normal display area DA2-N in which sizes (e.g., widths) of the second pixels P2 are substantially constant and a second buffer display area DA2-B in which sizes (e.g., widths) of the second pixels P2' and P2" are changed.

The second pixels P2 may have a substantially constant size (e.g., width) in the second normal display area DA2-N. For example, the second red pixels P2r may have substantially the same size (e.g., width) in the second normal display area DA2-N. Likewise, the second green pixels P2g may have substantially the same size (e.g., width) and the second blue pixels P2b may have substantially the same size (e.g., width) in the second normal display area DA2-N. Sizes (e.g., widths) of the second blue pixels P2b' and P2b" in the second buffer display area DA2-B may be different from the size (e.g., the width) of the second blue pixel P2b in the second normal display area DA2-N. For example, the sizes (e.g., the widths) of the second red pixels P2r' and P2r" in the second buffer display area DA2-B may be less than the size (e.g., the width) of the second red pixel P2r in the second normal display area DA2-N. Similarly, sizes (e.g., widths) of the second green pixels P2g' and P2g" in the second buffer display area DA2-B may be less than the size (e.g., the width) of the second green pixel P2g in the second normal display area DA2-N. Sizes (e.g., widths) of the second blue pixels P2b' and P2b" in the second buffer display area DA2-B may be less than the size (e.g., the width) of the second blue pixel P2g in the second normal display area DA2-N.

In the second buffer display area DA2-B, the sizes (e.g., the widths) of the second blue pixels P2b' and P2b" may be gradually changed. For example, the sizes (e.g., the widths) of the second blue pixels P2b' and P2b" may be gradually decreased in a direction from the second normal display area DA2-N toward the first display area DA1.

The size (e.g., the width) of the second red pixel P2r' in the second buffer display area DA2-B adjacent to the second normal display area DA2-N may be greater than the size (e.g., the width) of the second red pixel P2r" in the second buffer display area DA2-B adjacent to the first display area DA1. Likewise, the size (e.g., the width) of the second green pixel P2g' in the second buffer display area DA2-B adjacent to the second normal display area DA2-N may be greater than the size (e.g., the width) of the second green pixel P2g" in the second buffer display area DA2-B adjacent to the first display area DA1. The size (e.g., the width) of the second blue pixel P2b' in the second buffer display area DA2-B adjacent to the second normal display area DA2-N may be greater than the size (e.g., the width) of the second blue pixel P2b'' in the second buffer display area DA2-B adjacent to the first display area DA1. The second display area DA2 may include the second normal display area DA2-N, in which the density (for example, the number or the aperture ratio) of pixels per unit space (unit area) US is substantially constant, and the second buffer display area DA2-B, in which the density (for example, the number or the aperture ratio) of pixels per unit space (unit area) US is changed. In the second display area DA2, the number or the aperture ratio of pixels per a unit space US may be gradually decreased in the direction from the second display area DA2 toward the first display area DA1. For example, a first unit space US1 and a second unit space US2 may be arranged in the direction from the second display area DA2 toward the first display area DA1. The aperture ratio of pixels of the second unit space US2 may be less than the aperture ratio of pixels of the first unit space US1. According to another exemplary embodiment, the number of pixels of the second unit space US2 may be less than the number of pixels of the first unit space US1.

Figure 6:
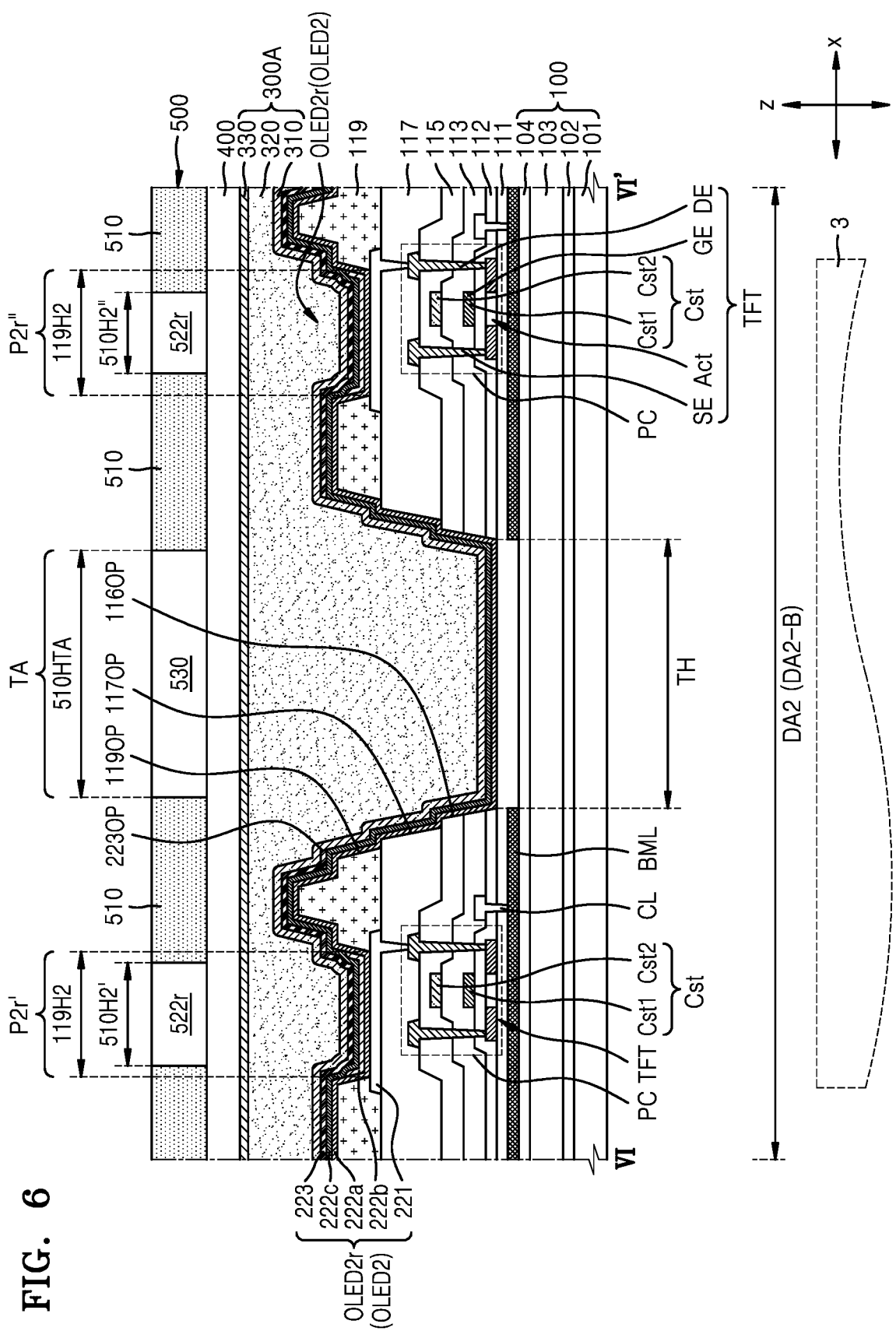
FIG. 6 is a cross-sectional view taken along a line VI-VI' of FIG. 5.

FIG. 6 is a cross-sectional view taken along a line VI-VI' of FIG. 5.

Referring to FIG. 6, the substrate 100 may include a plurality of layers. The substrate 100 may include a first base layer 101, a first barrier layer 102, a second base layer 103, and a second barrier layer 104.

Each of the first base layer 101 and the second base layer 103 may include polymer resins. The polymer resins may include polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), cellulose acetate propionate (CAP), or the like. The polymer resins may be transparent.

Each of the first barrier layer 102 and the second barrier layer 104 may be a barrier layer for preventing the penetration of external foreign materials and may include a single layer or multiple layers including an organic insulating material, such as silicon nitride, silicon oxynitride, and/or silicon oxide.

A back metal layer (e.g., blocking metal layer) BML may be disposed on the substrate 100. The back metal layer BML may be located in the second display area DA2 and may prevent damage to the pixel circuit PC caused by light (e.g., light emitted from a sensor, etc.) passing through the transmission area TA in the second display area DA2.

The back metal layer BML may include a through-hole TH corresponding to the transmission area TA. The back metal layer BML may include conductive metal, such as Al, Pt, Pd, Ag, Mg, Au, Ni, Nd, Ir, Cr, Ca, Mo, Ti, W, and/or Cu.

The back metal layer BML may be electrically connected to a connecting line CL. The connecting line CL may be electrically connected to the gate electrode GE, the source electrode SE, or the drain electrode DE of the thin-film transistor TFT or may be electrically connected to any one storage capacitor plate of the storage capacitor Cst as described below. Alternatively, the connecting line CL may be electrically connected to the driving voltage line PL (see FIG. 4). The back metal layer BML connected to the connecting line CL may protect the thin-film transistor TFT from external static electricity or improve the performance of the thin-film transistor TFT.

The buffer layer 111 may be disposed on the back metal layer BML. The pixel circuit PC including the thin-film transistor TFT and the storage capacitor Cst may be located on the buffer layer 111. In some exemplary embodiments, the storage capacitor Cst may overlap the thin-film transistor TFT. For example, the gate electrode GE of the thin-film transistor TFT may include the first storage capacitor plate Cst1 of the storage capacitor Cst. According to another exemplary embodiment, as described above with reference to FIG. 1, the storage capacitor Cst may not overlap the thin-film transistor TFT.

The thin-film transistor TFT may be covered by the planarization insulating layer 117. The buffer layer 111, the gate insulating layer 112, the first interlayer insulating layer 113, the second interlayer insulating layer 115, and the planarization insulating layer 117 are described above with reference to FIG. 1.

Each pixel circuit PC may be electrically connected to the second organic light-emitting diode OLED2. In this regard, FIG. 6 illustrates a second organic light-emitting diode OLED2r (OLED2) to emit a red light. The second organic light-emitting diode OLED2 may include the pixel electrode 221, the first functional layer 222a, the emission layer 222b, the second functional layer 222c, and the opposite electrode 223.

A thin-film encapsulation layer 300A may be disposed on the second organic light-emitting diode OLED2 as an encapsulation layer. According to an exemplary embodiment, the thin-film encapsulation layer 300A may include a first inorganic encapsulation layer 310, a second inorganic encapsulation layer 330, and an organic encapsulation layer 320 between the first and second inorganic encapsulation layers 310 and 330.

Each of the first and second inorganic encapsulation layers 310 and 330 may include at least one inorganic insulating material. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed by a chemical vapor deposition method.

The organic encapsulation layer 320 may include a polymer-based material. The polymer-based material may include acryl-based resins, epoxy-based resins, PI, and polyethylene. For example, the organic encapsulation layer 320 may include acryl-based resins, for example, polymethylmethacrylate, polyacrylic-acid, and the like. The organic encapsulation layer 320 may be formed by curing a monomer or coating a polymer.

The input sensing layer 400 may be disposed on the thin-film encapsulation layer 300A. The input sensing layer 400 may be directly formed on the thin-film encapsulation layer 300A. That is, an adhesive layer may not be additionally disposed between the input sensing layer 400 and the thin-film encapsulation layer 300A.

The filter layer 500 may be disposed on the input sensing layer 400. The light-shield portion 510 of the filter layer 500 may include second holes 510H2' and 510H2''. A second color filter, for example, a second red color filter 522r, may be located to correspond to the second holes 510H2' and 510H2'' of the light-shield portion 510.

The second holes 510H2' and 510H2'' of the light-shield portion 510 may define the second pixels P2', and P2''. FIG. 6 illustrates that the second holes 510H2' and 510H2'' of the light-shield portion 510 define the second red pixels P2r' and P2r''. For example, red light emitted from a second red organic light-emitting diode OLED2r may pass through the second holes 510H2' and 510H2'' of the light-shield portion 510 and be seen by a user.

Sizes (e.g., widths) of the second holes 510H2' and 510H2'' of the light-shield portion 510 may be less than the size (e.g., the width) of the second through-hole 119H2 of the upper insulating layer 119. The emission area of the red light emitted from the second red organic light-emitting diode OLED2r may have a size corresponding to the second through-hole 119H2 of the upper insulating layer 119. However, because the light passes through the second holes 510H2' and 510H2" of the light-shield portion 510, the areas of the second red pixels P2r' and P2r", which are seen from the outside of the display device, may be less than the emission area of the second organic light-emitting diode OLED2, i.e., the area of the second through-hole 119H2 of the upper insulating layer 119. For example, the size (e.g., the width) of the second pixel may be adjusted by using the sizes (e.g., the widths) of the second holes 510H2' and 510H2" of the light-shield portion 510.

The light-shield portion 510 may include a third hole 510HTA corresponding to the transmission area TA. The third hole 510HTA of the light-shield portion 510 may overlap the through-hole TH of the back metal layer BML. The width of the third hole 510HTA of the light-shield portion 510 may be substantially the same as or less than the width of the through-hole TH of the back metal layer BML. Alternatively, the width of the third hole 510HTA of the light-shield portion 510 may be substantially the same as or greater than the width of the through-hole TH of the back metal layer BML. A transparent layer 530 may be disposed in the third hole 510HTA. The transparent layer 530 may include a resin material.

When the display device is used as a component of an electronic apparatus, the electronic apparatus may further include the component 3 at a back surface of the display device. The component 3 is described above with reference to FIG. 2B.

In order to increase the degree of transmission of the transmission area TA, the insulating layers disposed on the substrate 100, such as the gate insulating layer 112, the first interlayer insulating layer 113, the second interlayer insulating layer 115, the planarization insulating layer 117, and the upper insulating layer 119 may include holes corresponding to the transmission area TA. In some exemplary embodiments, the buffer layer 111 on the substrate 100 may include a hole corresponding to the transmission area TA.

A first hole 116OP of at least one inorganic insulating layer 116, a second hole 117OP of the planarization insulating layer 117, and a third hole 119OP of the upper insulating layer 119 may overlap one another in the transmission area TA. The opposite electrode 223 may include a fourth hole 223OP located in the transmission area TA.

Figure 7B:
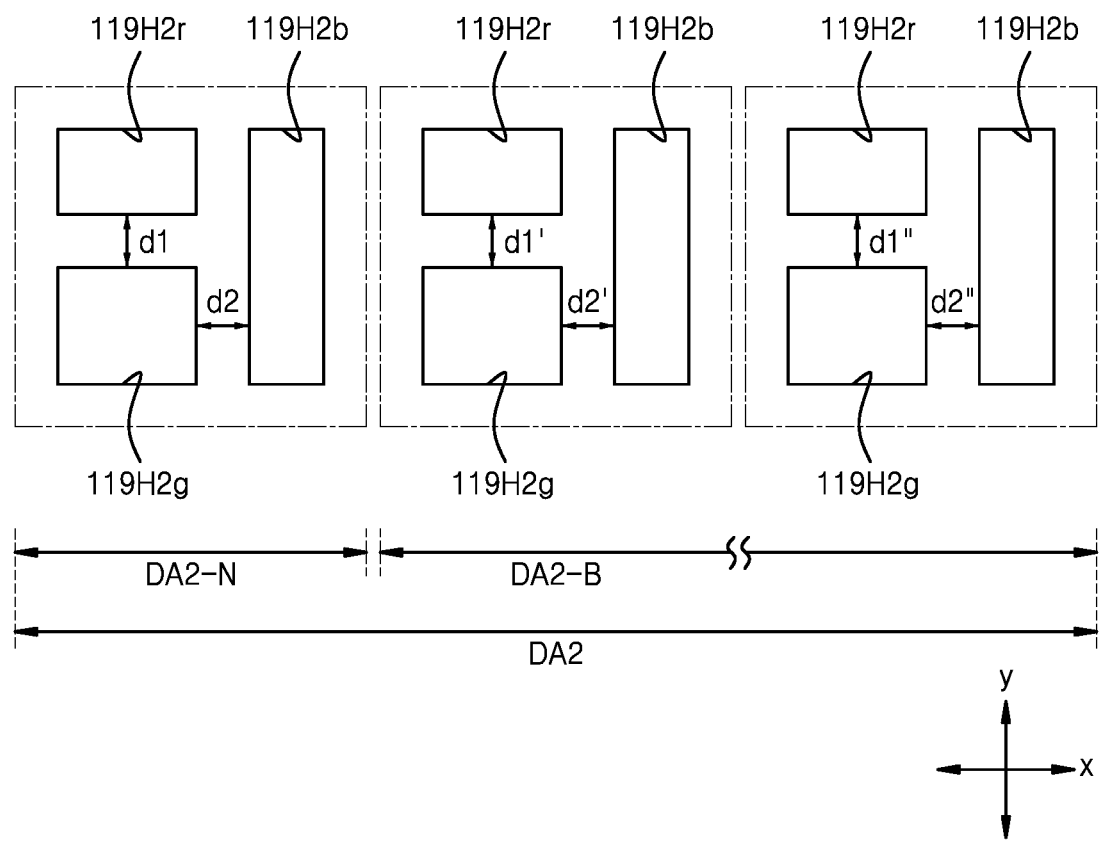
FIG. 7B is an enlarged plan view of a region of FIG. 7A.

FIG. 7A is a plan view of the upper insulating layer 119 used in a process of manufacturing the display device of FIG. 1, and FIG. 7B is an enlarged plan view of a region of FIG. 7A.

Referring to FIG. 7A, the upper insulating layer 119 may include a plurality of through-holes. The upper insulating layer 119 may include first through-holes 119H1 located in the first display area DA1 and second through-holes 119H2 located in the second display area DA2.

The second through-holes 119H2 may include a second-first through-hole 119H2r corresponding to a red pixel, a second-second through-hole 119H2g corresponding to a green pixel, and a second-third through-hole 119H2b corresponding to a blue pixel.

Sizes (e.g., widths) of through-holes corresponding to pixels of the same color in the second display area DA2 may be substantially the same as one another. As illustrated in FIG. 7B, the size (e.g., the width) of the second-first through hole 119H2r located in the second normal display area DA2-N may be substantially the same as the size (e.g., the width) of the second-first through-hole 119H2r located in the second buffer display area DA2-B.

Similarly, the size (e.g., the width) of the second-second through hole 119H2g located in the second normal display area DA2-N may be substantially the same as the size (e.g., the width) of the second-second through-hole 119H2g located in the second buffer display area DA2-B. The size (e.g., the width) of the second-third through hole 119H2b located in the second normal display area DA2-N may be substantially the same as the size (e.g., the width) of the second-third through-hole 119H2b located in the second buffer display area DA2-B.

The distance between the second through-holes corresponding to pixels of the different colors in the second normal display area DA2-N may be substantially the same as the distance between the second through-holes corresponding to pixels of the different colors in the second buffer display area DA2-B.

For example, referring to FIG. 7B, a first distance d1 and a second distance d2 between the through-holes adjacent to each other in the second normal display area DA2-N may be substantially the same as first distances d1' and d1" and second distances d2' and d2" between the through-holes adjacent to each other in the second buffer display area DA2-B, respectively.

Figure 8B:
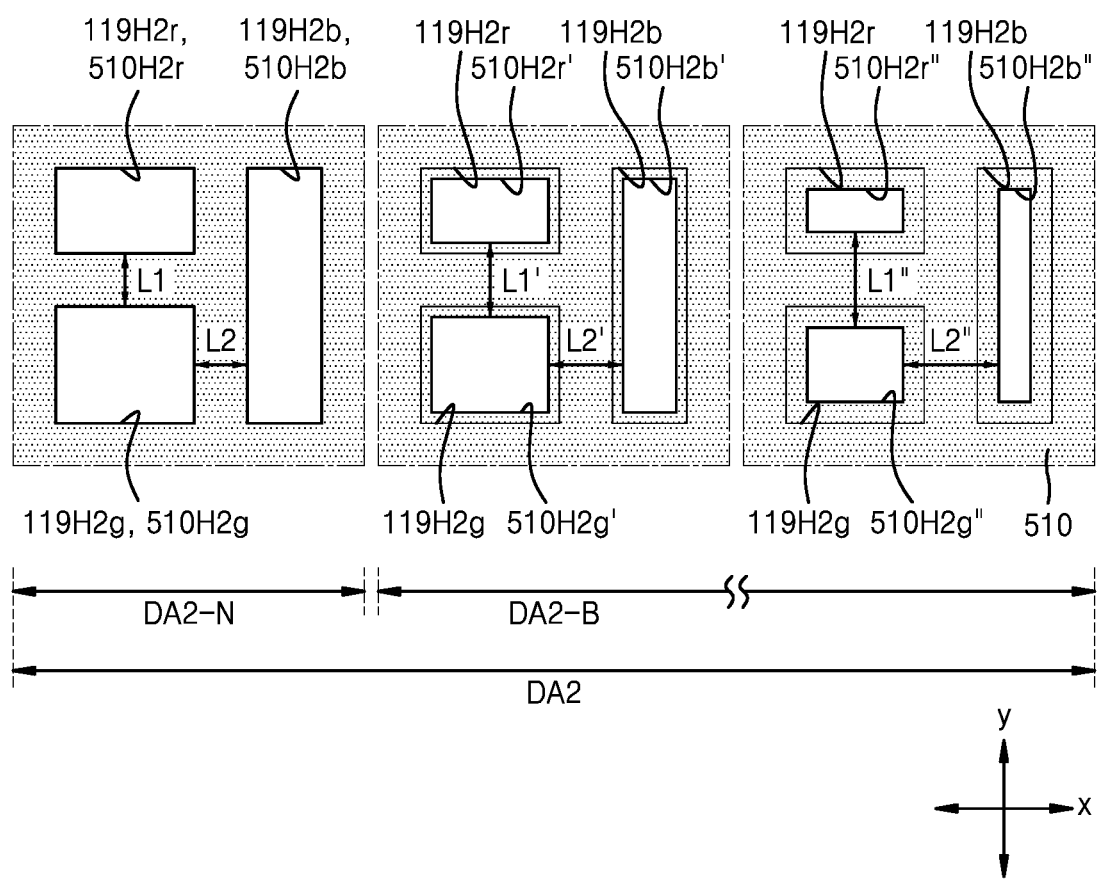
FIG. 8B is an enlarged plan view of a region of FIG. 8A.

FIG. 8A is a plan view of a filter layer 500 used in a process of manufacturing the display device of FIG. 1, and FIG. 8B is an enlarged plan view of a region of FIG. 8A.

Referring to FIG. 8A, the light-shield portion 510 of the filter layer 500 may include a plurality of holes.

The light-shield portion 510 may include the first holes 510H1 located in the first display area DA1, and the second holes 510H2 and the third holes 510HTA located in the second display area DA2. The third holes 510HTA may be located in the transmission area TA.

The second holes 510H2 may include a second-first hole 510H2r corresponding to the second red pixel P2r, a second-second hole 510H2g corresponding to the second green pixel P2g, and a second-third hole 510H2b corresponding to the second blue pixel P2b.

Sizes (e.g., widths) of holes corresponding to pixels of the same color in the second display area DA2 may be different from one another. For example, as illustrated in FIG. 8B, sizes (e.g., widths) of second-first holes 510H2r, 510H2r', and 510H2r" may be gradually decreased in a direction from the second normal display area DA2-N toward the second buffer display area DA2-B.

In the second normal display area DA2-N, the second-first hole 510H2r of the light-shield portion 510 may overlap a corresponding second-first through-hole 119H2r of the upper insulating layer 119 (see FIG. 7A). The second-first hole 510H2r may have a size (e.g., a width) that is substantially the same as or greater than the size (e.g., a width) of the second-first through-hole 119H2r. On the contrary, in the second buffer display area DA2-B, the second-first holes 510H2r' and 510H2r" of the light-shield portion 510 may overlap each corresponding second-first through-hole 119H2r. The second-first holes 510H2r' and 510H2r" may have sizes (e.g., widths) that are less than the size (e.g., the width) of the second-first through-hole 119H2r. Thus, a portion of the second-first through-hole 119H2r of the upper insulating layer 119 may overlap the light-shield portion 510, and a remaining portion of the second-first through-hole 119H2r may overlap the second-first holes 510H2r' and 510H2r".

Similarly, sizes (e.g., widths) of second-second holes 510H2g, 510H2g', and 510H2g" and second-third holes 510H2*b*, 510H2*b'*, and 510H2*b"* of the light-shield portion 510 in the second buffer display area DA2-B may gradually decrease in a direction from the second normal display area DA2-N to the second buffer display area DA2-B.

In the second normal display area DA2-N, the second-second hole 510H2*g* of the light-shield portion 510 may overlap a corresponding second-second through-hole 119H2*g* of the upper insulating layer 119. The second-second hole 510H2*g* may have a size (e.g., a width) that is substantially the same as or greater than a size (e.g., a width) of the corresponding second-second through hole 119H2*g*. Likewise, in the second normal display area DA2-N, the second-third hole 510H2*b* of the light-shield portion 510 may overlap the second-third through-hole 119H2*b* of the upper insulating layer 119. The second-third hole 510H2*b* may have a size (e.g., a width) that is substantially the same as or greater than a size (e.g., a width) of the second-third through hole 119H2*b*.

For example, in the second buffer display area DA2-B, the second-second holes 510H2*g'* and 510H2*g"* of the light-shield portion 510 may overlap a corresponding second-second through-hole 119H2*g* of the upper insulating layer 119, and the second-second holes 510H2*g'* and 510H2*g"* may have sizes (e.g., widths) that are less than the size (e.g., the width) of the corresponding second-second through-hole 119H2*g*. Thus, a portion of the second-second through-hole 119H2*g* of the upper insulating layer 119 may overlap the light-shield portion 510, and a remaining portion of the second-second through-hole 119H2*g* may overlap the second-second holes 510H2*g'* and 510H2*g"*.

In the second buffer display area DA2-B, second-third holes 510H2*b'* and 510H2*b"* of the light-shield portion 510 may overlap a corresponding second-third through-hole 119H2*b* of the upper insulating layer 119, and the second-third holes 510H2*b'* and 510H2*b"* may have sizes (e.g., widths) that are less than the size (e.g., the width) of the corresponding second-third through-hole 119H2*b*. Thus, a portion of the second-third through-hole 119H2*b* of the upper insulating layer 119 may overlap the light-shield portion 510, and a remaining portion of the second-third through-hole 119H2*b* may overlap the second-third holes 510H2*b'* and 510H2*b"*.

The distance between the second holes corresponding to pixels of the different colors in the second normal display area DA2-N may be different from the distance between the second through-holes corresponding to pixels of the different colors in the second buffer display area DA2-B.

For example, a first distance L1 and a second distance L2 between the second holes adjacent to each other in the second normal display area DA2-N may be less than first distances L1' and L1" and second distances L2' and L2" between the second holes adjacent to each other in the second buffer display area DA2-B, respectively.

Figure 9:
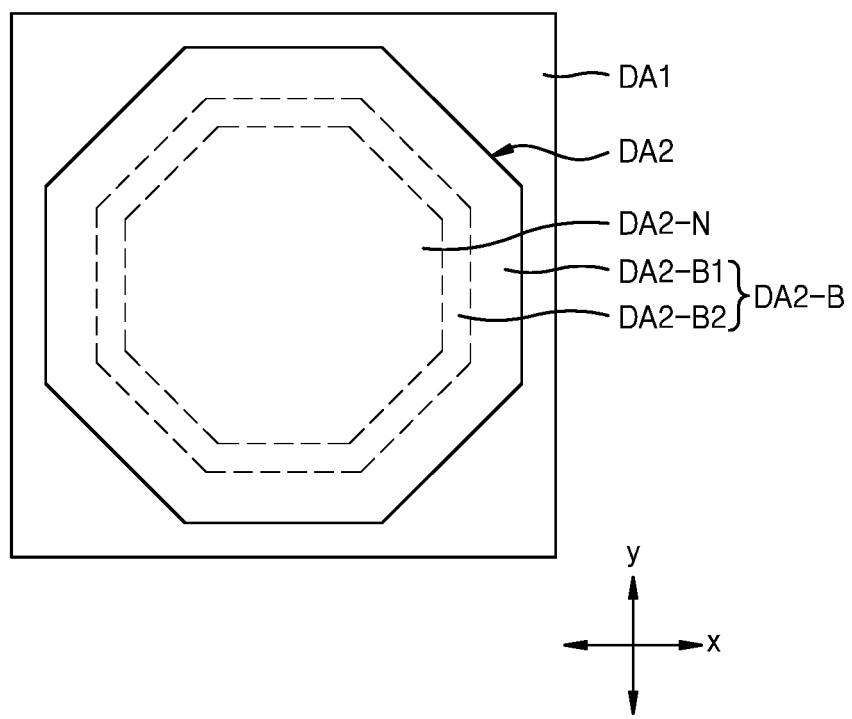
FIG. 9 is a plan view of a portion of the display area of the display device of FIG. 3A.

FIG. 9 is a plan view of a portion of the display area of the display device of FIG. 3A.

Referring to FIG. 9, the second display area DA2 may be disposed in the first display area DA1 and the second display area DA2 may be entirely surrounded by the first display area DA1. The second display area DA2 may include the second normal display area DA2-N and the second buffer display area DA2-B surrounding the second normal display area DA2-N.

The second pixels arranged in the second normal display area DA2-N and the second buffer display area DA2-B are described above with reference to FIGS. 5 through 8B. The second buffer display area DA2-B may include a plurality of sub-second buffer display areas DA2-B1 and DA2-B2 according to sizes (e.g., widths) of the second pixels arranged in the second buffer display area DA2-B. For example, the size (e.g., the width) of the second pixel arranged in the first sub-second buffer display area DA2-B1 may be less than the size (e.g., the width) of the second pixel arranged in the second sub-second buffer display area DA2-B2.

As described according to the one or more exemplary embodiments with reference to FIGS. 5 through 8B, when the sizes (e.g., the widths) of the second pixels in the second display area DA2 are gradually decreased in the direction from the second display area DA2 toward the first display area DA1, the boundary (interface) between the first display area DA1 and the second display area DA2 may be prevented from being seen by a user.

Figure 10:
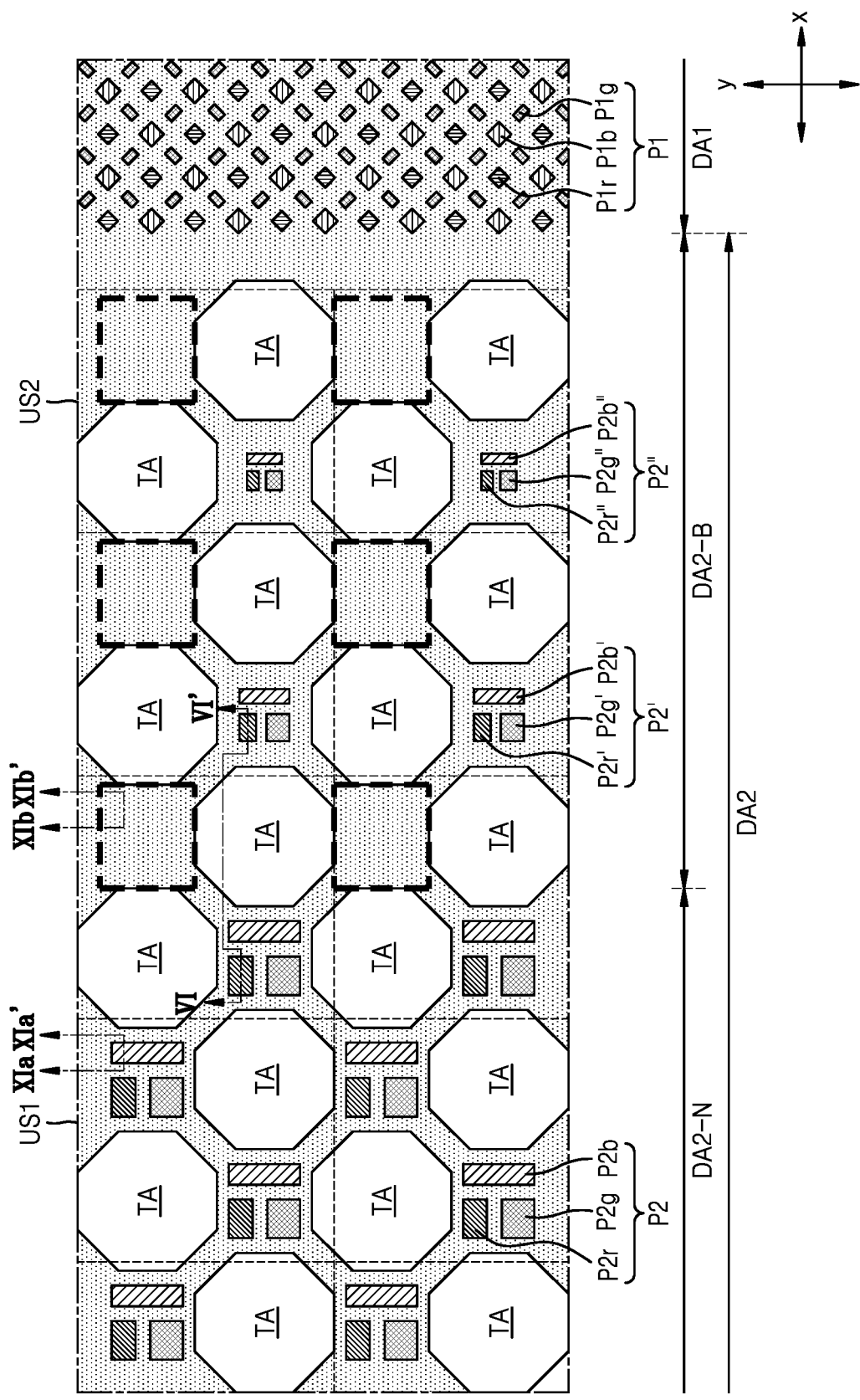
FIG. 10 is a plan view of a portion of another exemplary embodiment of a display device constructed according to the principles of the invention.
Figure 11:
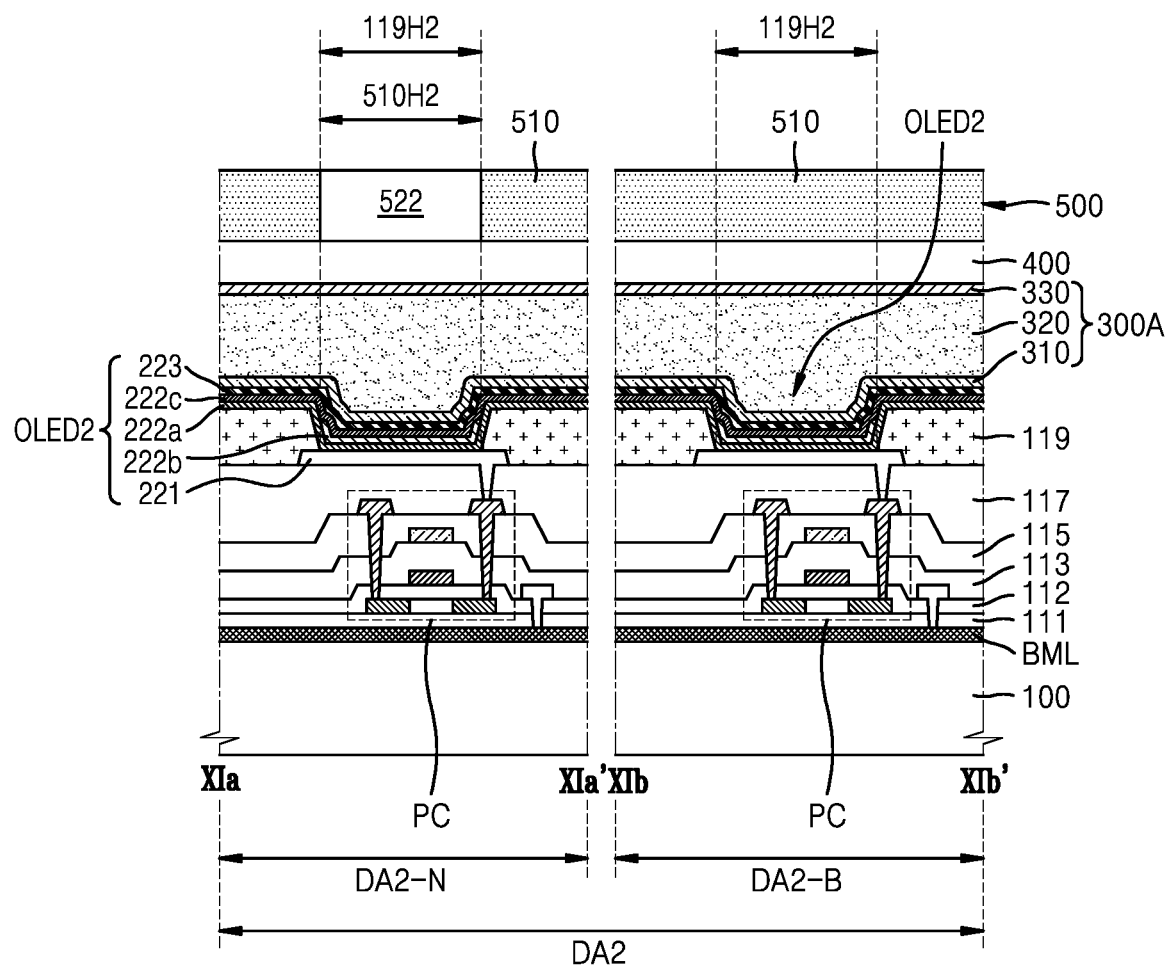
FIG. 11 is a cross-sectional view taken along lines XIa-XIa' and XIb-XIb' of FIG. 10.

FIG. 10 is a plan view of a portion of another exemplary embodiment of a display device constructed according to the principles of the invention, and FIG. 11 is a cross-sectional view taken along lines XIa-XIa' and XIb-XIb' of FIG. 10.

Referring to FIG. 10, the first pixels P1 and the second pixels P2, P2', and P2" may be arranged in the first and second display areas DA1 and DA2, respectively. Also, sizes (e.g., widths) of the second pixels P2, P2', and P2" may be different between the second normal display area DA2-N and the second buffer display area DA2-B, as described above with reference to FIGS. 5 through 8B. In some exemplary embodiments, the second pixels may not be arranged in adjacent transmission areas TA, as indicated by dashed lines in FIG. 10.

For example, the cross-sectional structure of pixel circuit PC and the second organic light-emitting diode OLED2 of FIG. 11 is the same as the structure of those illustrated in FIG. 6.

The cross-sectional structure of FIG. 11, which is taken along the line XIa-XIa', is substantially the same as the cross-sectional structure of the second normal display area DA2-N described above with reference to FIG. 6. For example, the light-shield portion 510 of the filter layer 500 may include the second organic light-emitting diode OLED2, and the second hole 510H2 overlapping the second through-hole 119H2 of the upper insulating layer 119. The size (e.g., the width) of the second hole 510H2 of the light-shield portion 510 may be substantially the same as the size (e.g., the width) of the second through-hole 119H2 of the upper insulating layer 119.

Referring to the cross-sectional structure of FIG. 11, which is taken along the line XIb-XIb', the second organic light-emitting diode OLED2 disposed in the second buffer display area DA2-B may be covered (e.g., entirely covered) by the light-shield portion 510. In some exemplary embodiments, the second organic light-emitting diode OLED2 may be a type of dummy organic light-emitting diode.

According to the exemplary embodiments described with reference to FIGS. 5 through 11, the second display area DA2 includes the second normal display area DA2-N and the second buffer display area DA2-B according to the sizes (e.g., the widths) of the second pixels P2 in the second display area DA2. However, exemplary embodiments are not limited thereto. According to another exemplary embodiment, the first display area DA1 may include a normal area and a buffer area.

In the display device having the structure of FIGS. 10 and 11, the density of pixels (for example, the number of pixels and/or the aperture ratio of pixels) may be decreased in a direction from the second display area DA2 toward the first display area DA1. For example, the first unit space US1 and the second unit space US2 may be arranged in the direction from the second display area DA2 toward the first display area DA1. The aperture ratio of pixels of the second unit space US2 may be less than the aperture ratio of pixels of the first unit space US1, and the number of pixels of the second unit space US2 may be less than the number of pixels of the first unit space US1.

Figure 12:
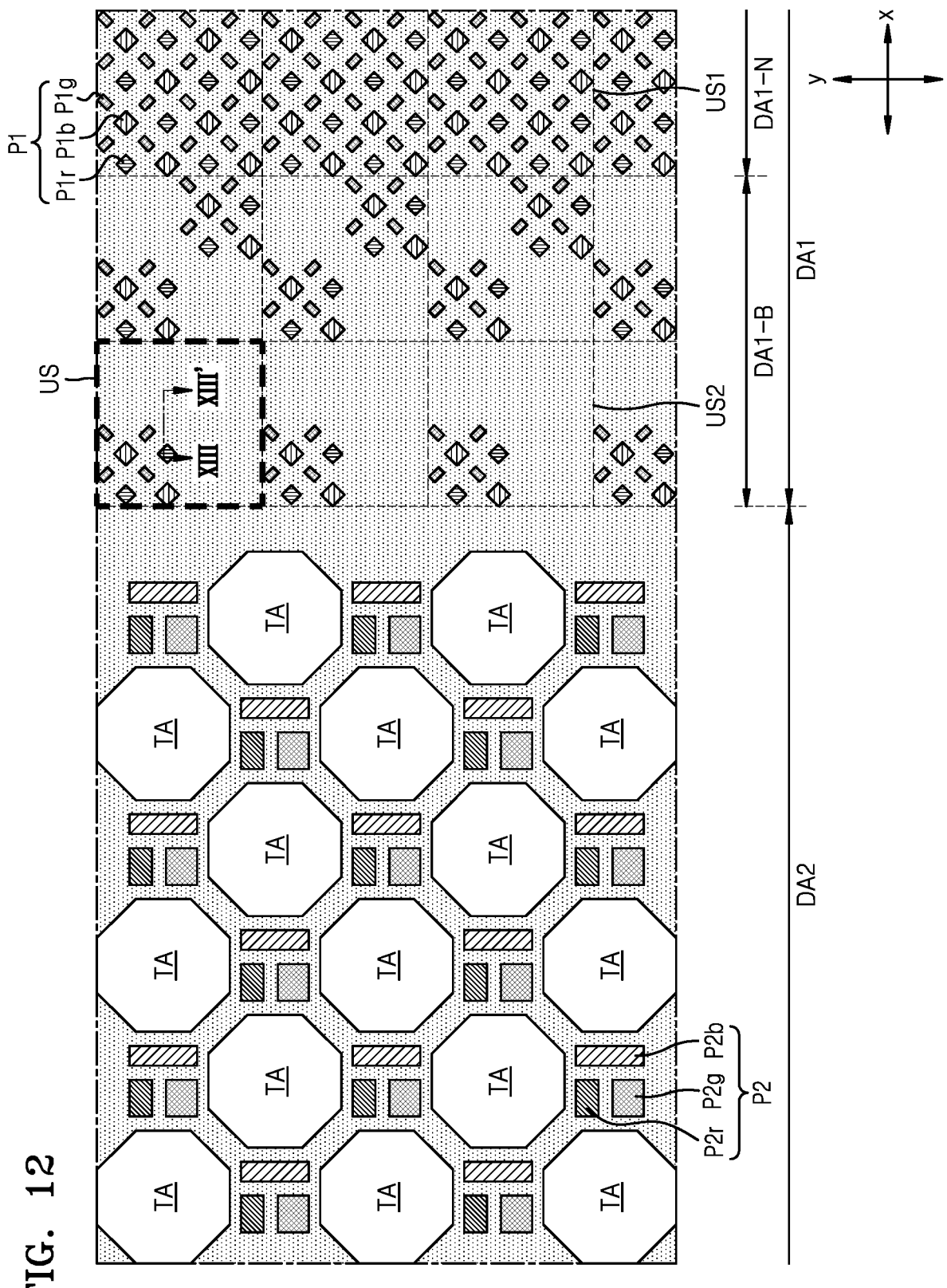
FIG. 12 is a plan view of a portion of another exemplary embodiment of a display device constructed according to the principles of the invention.
Figure 13:
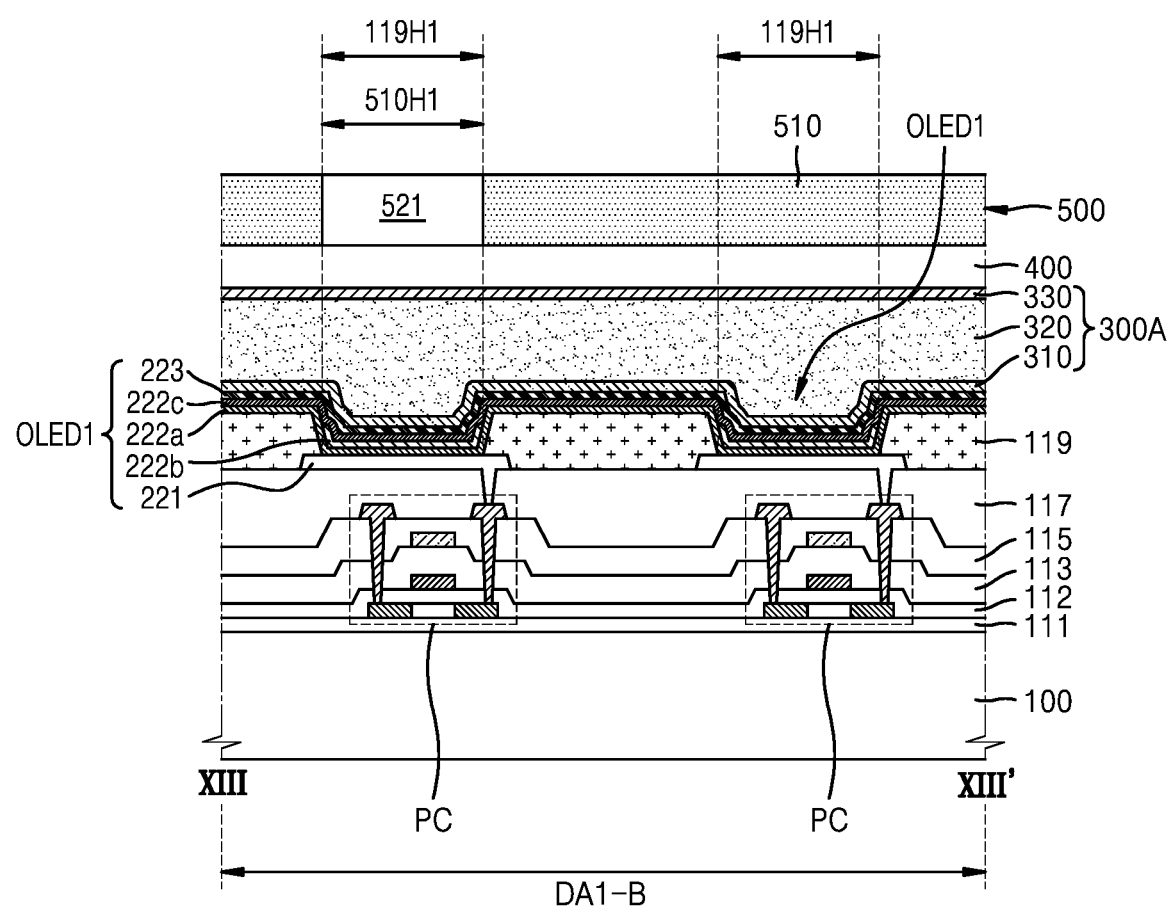
FIG. 13 is a cross-sectional view taken along a line XIII-XIII' of FIG. 12.

FIG. 12 is a plan view of a portion oft another exemplary embodiment of a display device constructed according to the principles of the invention, and FIG. 13 is a cross-sectional view of the display device, which is taken along a line Xlll-Xlll' of FIG. 12.

Referring to FIG. 12, the first display area DA1 may include a first normal display area DA1-N, in which the number or aperture ratio of pixels per a unit space US is substantially constant, and a first buffer display area DA1-B, in which the number or aperture ratio of pixels per a unit space US is changed. For example, in the first display area DA1, the number or the aperture ratio of pixels per the unit space US may be gradually decreased in a direction from the first display area DA1 toward the second display area DA2. Unit spaces US may include the first unit space US1 in a first normal display area DA1-N and the second unit space US2 in first buffer display area DA1-B. The first unit space US1 and the second unit space US2 may be arranged in the direction from the first display area DA1 toward the second display area DA2. The number of pixels of the second unit space US2 may be less than the number of pixels of the first unit space US1. Alternatively, the aperture ratio of pixels of the second unit space US2 may be less than the aperture ratio of pixels of the first unit space US1.

Referring to FIG. 13, the first organic light-emitting diodes OLED1 may be disposed in the first normal display area DA1-N and each of the first organic light-emitting diodes OLED1 may be connected to the pixel circuit PC disposed on the substrate 100. The structure of the pixel circuit PC, and the buffer layer 111, the gate insulating layer 112, the first interlayer insulating layer 113, the second interlayer insulating layer 115, the planarization insulating layer 117, and the upper insulating layer 119 disposed on the substrate 100 are the same as described above.

The first organic light-emitting diodes OLED1 including a stack of the pixel electrode 221, the first functional layer 222a, the emission layer 222b, the second functional layer 222c, and the second electrode 230 may be covered by the thin-film encapsulation layer 300A. Also, the input sensing layer 400 and the filter layer 500 may be disposed on the thin-film encapsulation layer 300A.

At least one of the first organic light-emitting diodes OLED1 in the first buffer display area DA1-B may be overlapped by the first hole 510H1 of the light-shield portion 510. According to an exemplary embodiment, the first hole 510H1 of the light-shield portion 510 may overlap a corresponding first through-hole 119H1 of the upper insulating layer 119, and the size (e.g., the width) of the first hole 510H1 may be substantially the same as or greater than the size (e.g., the width) of the corresponding first through-hole 119H1.

The remaining first organic light-emitting diodes OLED1 of the first organic light-emitting diodes OLED1 in the first buffer display area DA1-B may be covered (e.g., entirely covered) by the light-shield portion 510. In some exemplary embodiments, the first organic light-emitting diode OLED1 may be a type of dummy organic light-emitting diode.

In FIGS. 12 and 13, the second pixels P2 arranged in the second display area DA2, for example, the red, green, and second blue pixels P2r, P2g, and P2b each may have a substantially constant size (e.g., width). However, according to other exemplary embodiments, the second pixels P2 may be arranged in the second display area DA2 as described above with reference to FIG. 5 or 10.

According to the one or more of the above exemplary embodiments, the pixels may be defined by simply using the light-shield portion, without adjusting the size (e.g., the width) of the through-hole of the upper insulating layer. Thus, by using a relatively simple process, the density of the pixels (for example, the number or aperture ratio of the pixels) may be adjusted. By adjusting the density of the pixels as described above, the visibility of the boundary between the first display area and the second display area may be reduced or entirely prevented from being seen by a user.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate;
   a plurality of light-emitters on the substrate, the plurality of light-emitters including a first light-emitter in a first display area and a second light-emitter in a second display area, the first light-emitter and second light-emitter being configured to emit light of a same color, wherein the second display area comprises a light transmission area having a higher light transmissivity than the first display area without including a pixel circuit;
   an insulating layer including a first through-hole and a second through-hole, the first through-hole of the insulating layer overlapping a first electrode of the first light-emitter, and the second through-hole of the insulating layer overlapping a first electrode of the second light-emitter;
   an inorganic insulating layer between the substrate and the first electrode of the second light-emitter, the inorganic insulating layer including a through-hole overlapping the light transmission area; and
   a filter disposed on the plurality of light-emitters and including a light-shield and color filters,
   wherein at least a portion of the second through-hole overlaps the light-shield, and
   wherein the light-shield has a first-second opening overlapping with the second light-emitter in the second display area and a second-second opening overlapping with another second light-emitter in the second display area, the first-second opening having a different size from that of the second-second opening, and the second light-emitter and the other second light emitter of the second display area being configured to emit light of the same color as each other.

2. The display device of claim 1, wherein the light-shield comprises:
   a first opening overlapping the first through-hole of the insulating layer; and
   the first-second opening overlapping the second through-hole of the insulating layer, and
   wherein the first opening has a first size and the first-second opening has a second size less than the first size.

3. The display device of claim 2, wherein the color filters comprise:

a first color filter disposed in the first opening; and
a second color filter disposed in the first-second opening and having substantially a same color as the first color filter.

4. The display device of claim 2, wherein the second size of the first-second opening is less than a size of the second through-hole of the insulating layer.

5. The display device of claim 1, wherein the second through-hole of the insulating layer is substantially entirely covered by the light-shield.

6. A display device comprising:
a substrate;
a plurality of light-emitters on the substrate, the plurality of light-emitters disposed in a display area including a first display area and a second display area, wherein the second display area comprises a light transmission area which does not include a pixel;
an insulating layer including a plurality of through-holes overlapping first electrodes of the plurality of light-emitters;
an inorganic insulating layer between the substrate and the first electrodes of the plurality of light-emitters, the inorganic insulating layer including a through-hole overlapping the light transmission area;
a light-shield disposed on the plurality of light-emitters and including a plurality of openings, the plurality of openings defining pixels and overlapping at least one of the plurality of through-holes of the insulating layer; and
color filters disposed in the plurality of openings of the light-shield,
wherein the at least one of the plurality of through-holes of the insulating layer overlaps the light-shield, and
wherein a first opening of the plurality of openings in the light-shield overlaps with a first-second light-emitter of the plurality of light-emitters in the second display area and a second opening of the plurality of openings overlaps with a second-second light-emitter of the plurality of light-emitters in the second display area, the first opening having a different size from that of the second opening, and the first-second light-emitter and the second-second light-emitter being configured to emit light of a same color as each other.

7. The display device of claim 6, wherein:
a number or an aperture ratio of pixels in a first unit area is greater than a number or an aperture ratio of pixels in a second unit area, and
the first unit area and the second unit area have substantially a same size.

8. The display device of claim 7, wherein:
the plurality of light-emitters comprise a first light-emitter in the first display area, and the first light emitter and the first-second and second-second light-emitters are configured to emit light of the same color,
the insulating layer comprises a first through-hole overlapping the first electrode of the first light-emitter and a second through-hole overlapping the first electrode of the first-second light-emitter, and
the second through-hole of the insulating layer overlaps the light-shield.

9. The display device of claim 8, wherein:
a portion of the second through-hole of the insulating layer overlaps one of the plurality of openings of the light-shield, and
a remaining portion of the second through-hole overlaps the light-shield.

10. The display device of claim 9, wherein:
another one of the plurality of openings of the light-shield overlaps the first through-hole of the insulating layer, and
the one of the plurality of openings of the light-shield has a size less than a size of the another one of the plurality of openings of the light-shield.

11. The display device of claim 10, wherein the color filters comprise:
a first color filter disposed in the another one of the plurality of openings in the light-shield; and
a second color filter located in the one of the plurality of openings of the light-shield and having substantially a same color as the first color filter.

12. The display device of claim 8, wherein the second through-hole of the insulating layer is substantially entirely covered by the light-shield.

13. An electronic apparatus comprising:
a display device including a first display area and a second display area, wherein the second display area comprises a light transmission area having a higher transmissivity than the first display area without including a pixel circuit; and
a component overlapping the light transmission area in the second display area, wherein
the display device comprises:
a substrate;
a plurality of light-emitters on the substrate;
an insulating layer comprising a plurality of through-holes, the plurality of through-holes overlapping first electrodes of the plurality of light-emitters;
an inorganic insulating layer between the substrate and the first electrodes of the plurality of light-emitters, the inorganic insulating layer including a through-hole overlapping the light transmission area;
a light-shield disposed on the plurality of light-emitters and including a plurality of openings, the plurality of openings defining pixels and overlapping at least one of the plurality of through-holes of the insulating layer; and
color filters disposed in the plurality of openings of the light-shield,
wherein at least one of the plurality of through-holes of the insulating layer overlaps the light-shield, and
wherein a first opening of the plurality of openings in the light-shield overlaps with a first-second light-emitter of the plurality of light-emitters in the second display area and a second opening of the plurality of openings overlaps with a second-second light-emitter of the plurality of light-emitters in the second display area, the first opening having a different size from that of the second opening, and the first-second light-emitter and the second-second light-emitter being configured to emit light of a same color as each other.

14. The electronic apparatus of claim 13, wherein:
a number or an aperture ratio of pixels in a first unit area is greater than a number or an aperture ratio of pixels in a second unit area, and
the first unit area and the second unit area have substantially a same size.

15. The electronic apparatus of claim 14, wherein:
the plurality of light-emitters comprise a first light-emitter in the first display area, and the first light-emitter and the first-second and second-second light-emitters are configured to emit light of the same color,
the insulating layer comprises a first through-hole overlapping a first electrode of the first light-emitter and a second through-hole overlapping a first electrode of the first-second light-emitter, and at least a portion of the second through-hole overlaps the light-shield.

16. The electronic apparatus of claim 15, wherein:

a portion of the second through-hole of the insulating layer overlaps one of the plurality of openings of the light-shield, and a remaining portion of the second through-hole overlaps the light-shield.

17. The electronic apparatus of claim 16, wherein:

another one of the plurality of openings of the light-shield overlaps the first through-hole of the insulating layer, and the one of the plurality of openings of the light-shield is a size less than a size of the another one of the plurality of openings of the light-shield.

18. The electronic apparatus of claim 17, wherein the color filters comprise:

a first color filter disposed in the another one of the plurality of openings of the light-shield; and a second color filter disposed in the one of the plurality of openings of the light-shield and having a same color as the first color filter.

19. The electronic apparatus of claim 15, wherein the second through-hole of the insulating layer is substantially entirely covered by the light-shield.

20. The electronic apparatus of claim 13, wherein the component comprises a sensor or a camera.

* * * * *